(12) United States Patent
Chu et al.

(10) Patent No.: US 12,211,749 B2
(45) Date of Patent: Jan. 28, 2025

(54) CUT EPI PROCESS AND STRUCTURES

(71) Applicant: Taiwan Semiconductor Manufacturing Co., Ltd., Hsin-Chu (TW)

(72) Inventors: Feng-Ching Chu, Hsinchu (TW); Wei-Yang Lee, Taipei (TW); Chia-Pin Lin, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 220 days.

(21) Appl. No.: 17/815,302

(22) Filed: Jul. 27, 2022

(65) Prior Publication Data

US 2022/0367277 A1    Nov. 17, 2022

Related U.S. Application Data

(62) Division of application No. 16/887,273, filed on May 29, 2020, now Pat. No. 11,515,211.

(60) Provisional application No. 62/982,412, filed on Feb. 27, 2020.

(51) Int. Cl.
| | |
|---|---|
| H01L 29/66 | (2006.01) |
| H01L 21/308 | (2006.01) |
| H01L 21/8234 | (2006.01) |
| H01L 27/088 | (2006.01) |
| H01L 29/08 | (2006.01) |

(52) U.S. Cl.
CPC .. *H01L 21/823418* (2013.01); *H01L 21/3086* (2013.01); *H01L 21/823431* (2013.01); *H01L 27/0886* (2013.01); *H01L 29/0847* (2013.01); *H01L 29/66545* (2013.01); *H01L 29/6681* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,836,016 B2 | 9/2014 | Wu et al. |

(Continued)

FOREIGN PATENT DOCUMENTS

| | | |
|---|---|---|
| CN | 108122771 A | 6/2018 |
| CN | 108122846 A | 6/2018 |

(Continued)

*Primary Examiner* — Joseph C. Nicely
*Assistant Examiner* — Lamont B Koo
(74) *Attorney, Agent, or Firm* — HAYNES AND BOONE, LLP

(57) ABSTRACT

A device includes a substrate, an isolation structure over the substrate, and two fins extending from the substrate and above the isolation structure. Two source/drain structures are over the two fins respectively and being side by side along a first direction generally perpendicular to a lengthwise direction of the two fins from a top view. Each of the two source/drain structures has a near-vertical side, the two near-vertical sides facing each other along the first direction. A contact etch stop layer (CESL) is disposed on at least a lower portion of the near-vertical side of each of the two source/drain structures. And two contacts are disposed over the two source/drain structures, respectively, and over the CESL.

20 Claims, 22 Drawing Sheets

(56) References Cited

U.S. PATENT DOCUMENTS

| | | |
|---|---|---|
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 9,093,514 B2 | 7/2015 | Tsai et al. |
| 9,105,490 B2 | 8/2015 | Wang et al. |
| 9,236,267 B2 | 1/2016 | De et al. |
| 9,236,300 B2 | 1/2016 | Liaw |
| 9,245,805 B2 | 1/2016 | Yeh et al. |
| 9,257,439 B2 | 2/2016 | Liaw |
| 9,520,482 B1 | 12/2016 | Chang et al. |
| 9,576,814 B2 | 2/2017 | Wu et al. |
| 9,601,856 B2 | 3/2017 | Kittl et al. |
| 10,319,581 B1 | 6/2019 | Wen et al. |
| 10,490,552 B2 | 11/2019 | Lee et al. |
| 2013/0171790 A1 | 7/2013 | Wang |
| 2014/0001572 A1 | 1/2014 | Bohr et al. |
| 2014/0134814 A1 | 5/2014 | Wong et al. |
| 2018/0151564 A1 | 5/2018 | Lee et al. |
| 2018/0174912 A1 | 6/2018 | Lee et al. |
| 2019/0067130 A1 | 2/2019 | Koh |
| 2019/0164741 A1 | 5/2019 | Wen et al. |
| 2019/0318922 A1 | 10/2019 | Wen et al. |
| 2020/0006336 A1 | 1/2020 | Lung et al. |

FOREIGN PATENT DOCUMENTS

| | | |
|---|---|---|
| CN | 109585552 A | 4/2019 |
| CN | 109860117 A | 6/2019 |
| KR | 20170051154 | 5/2017 |
| KR | 20180060909 | 6/2018 |
| KR | 20180069674 | 6/2018 |
| KR | 20190002247 A | 1/2019 |
| KR | 20190094977 A | 8/2019 |
| KR | 20190125910 A | 11/2019 |

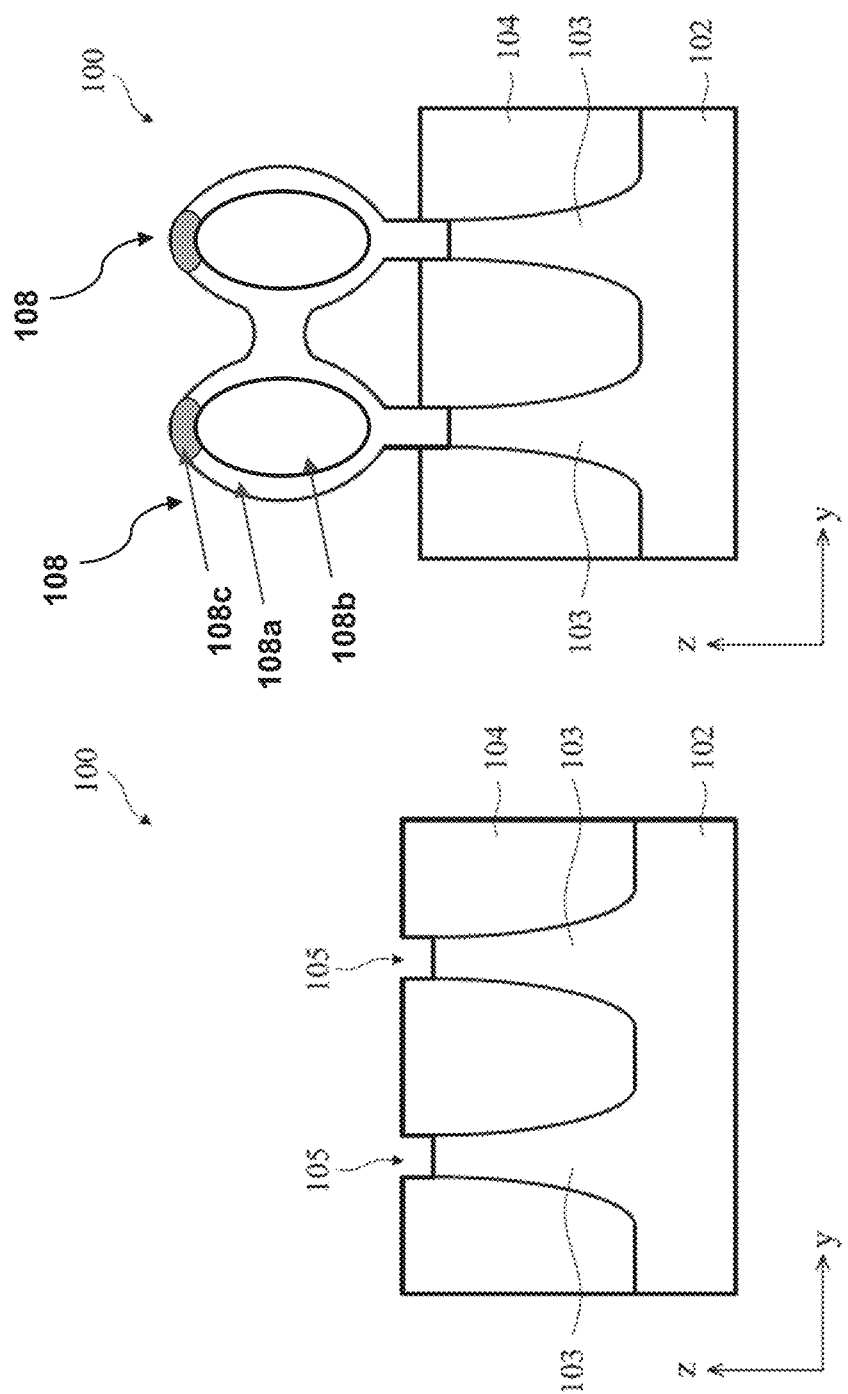

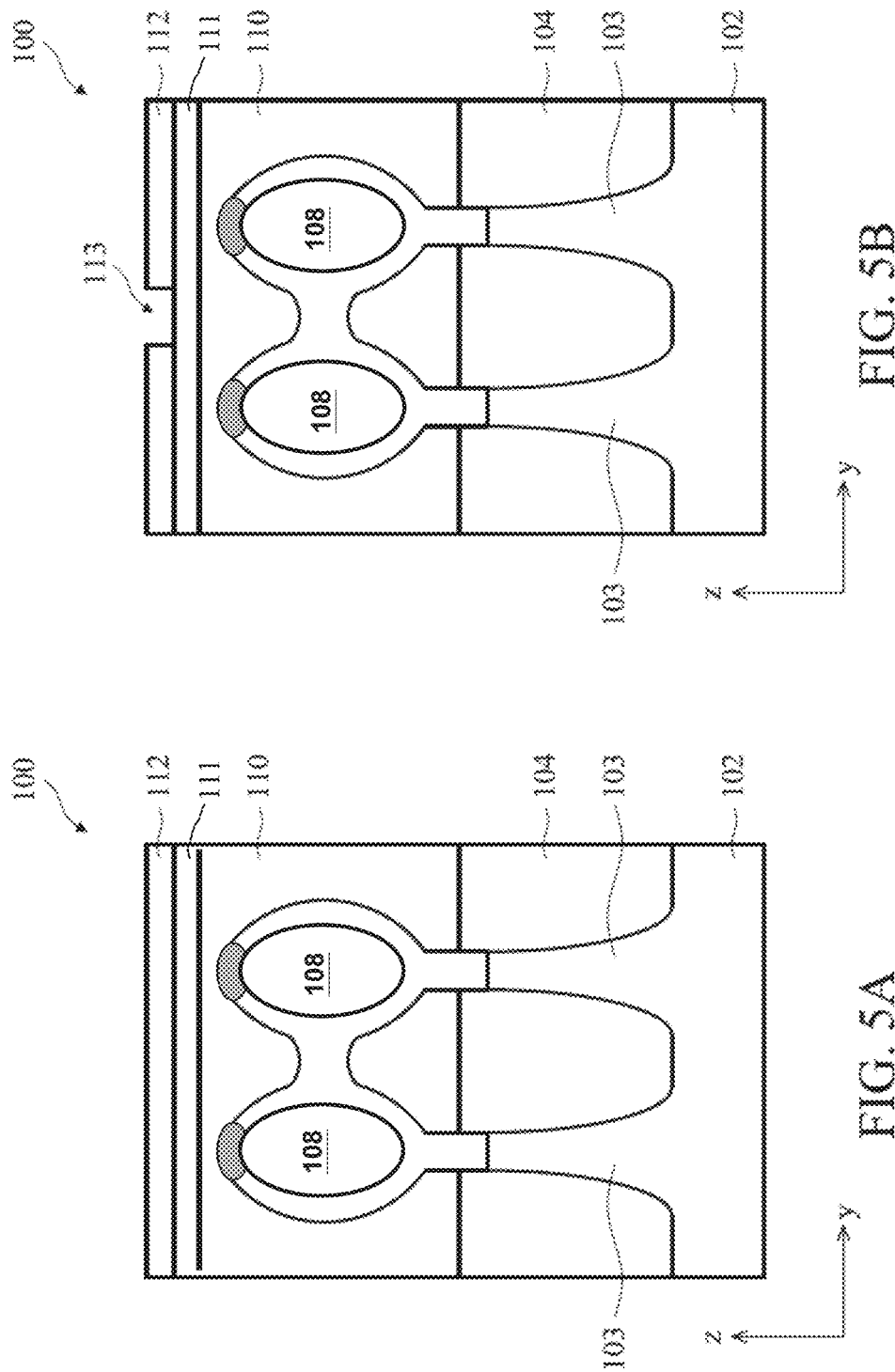

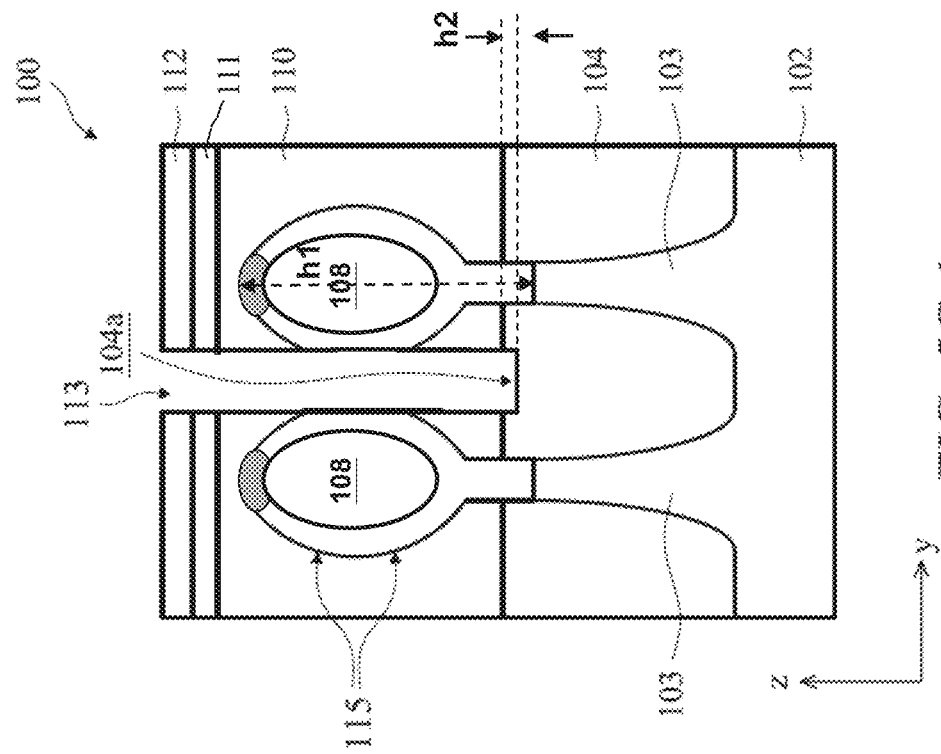
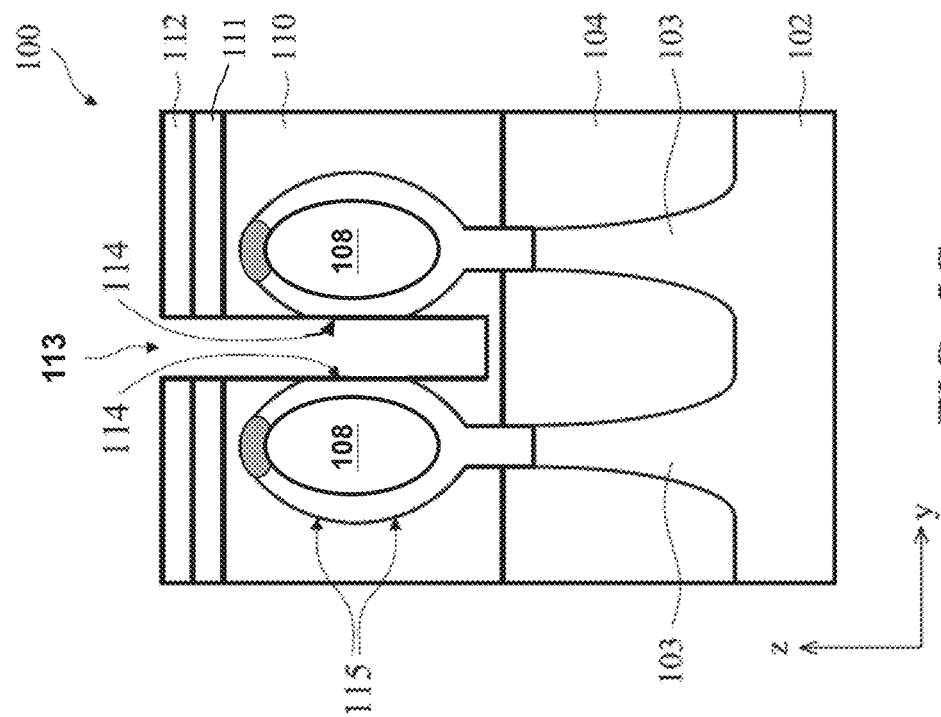
FIG. 5C
FIG. 5C-1

CUT EPI PROCESS AND STRUCTURES

PRIORITY

This is a divisional application of U.S. application Ser. No. 16/887,273, filed May 29, 2020, which claims the benefits of and priority to U.S. Provisional Application Ser. No. 62/982,412, titled "Cut EPI Process and Structures" filed Feb. 27, 2020, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as functional density increases, epitaxially growing source/drain (S/D) features becomes more challenging. On the one hand, having large epitaxial S/D features is generally desirable for reducing S/D contact resistance. On the other hand, having large epitaxial S/D features also increases the spacing requirements among the devices, thereby undesirably reducing device integration. If the spacing among S/D features is insufficient, the S/D features may merge and cause short circuit defects. An object of the present disclosure seeks to resolve this issue, among others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-1 and 2A-2 show schematic representations of the device of FIG. 2A according to an embodiment.

FIG. 2C-1 illustrates a cross-sectional view of a portion of a semiconductor device along the A-A line in FIGS. 2A and 2B, according to an alternative embodiment.

FIGS. 3, 4, 5A, 5B, 5C, 5C-1, 5D, 6, 6-1, 7, 8A, 8B, 8C, 9, 10, 11, 12, and 13 illustrate cross sectional views of forming a semiconductor device according to the method of FIG. 1, in accordance with some embodiments.

FIG. 5B-1 illustrates a top view of forming a semiconductor device according to the method of FIG. 1, in accordance with an embodiment.

DETAILED DESCRIPTION

Figure 1A:
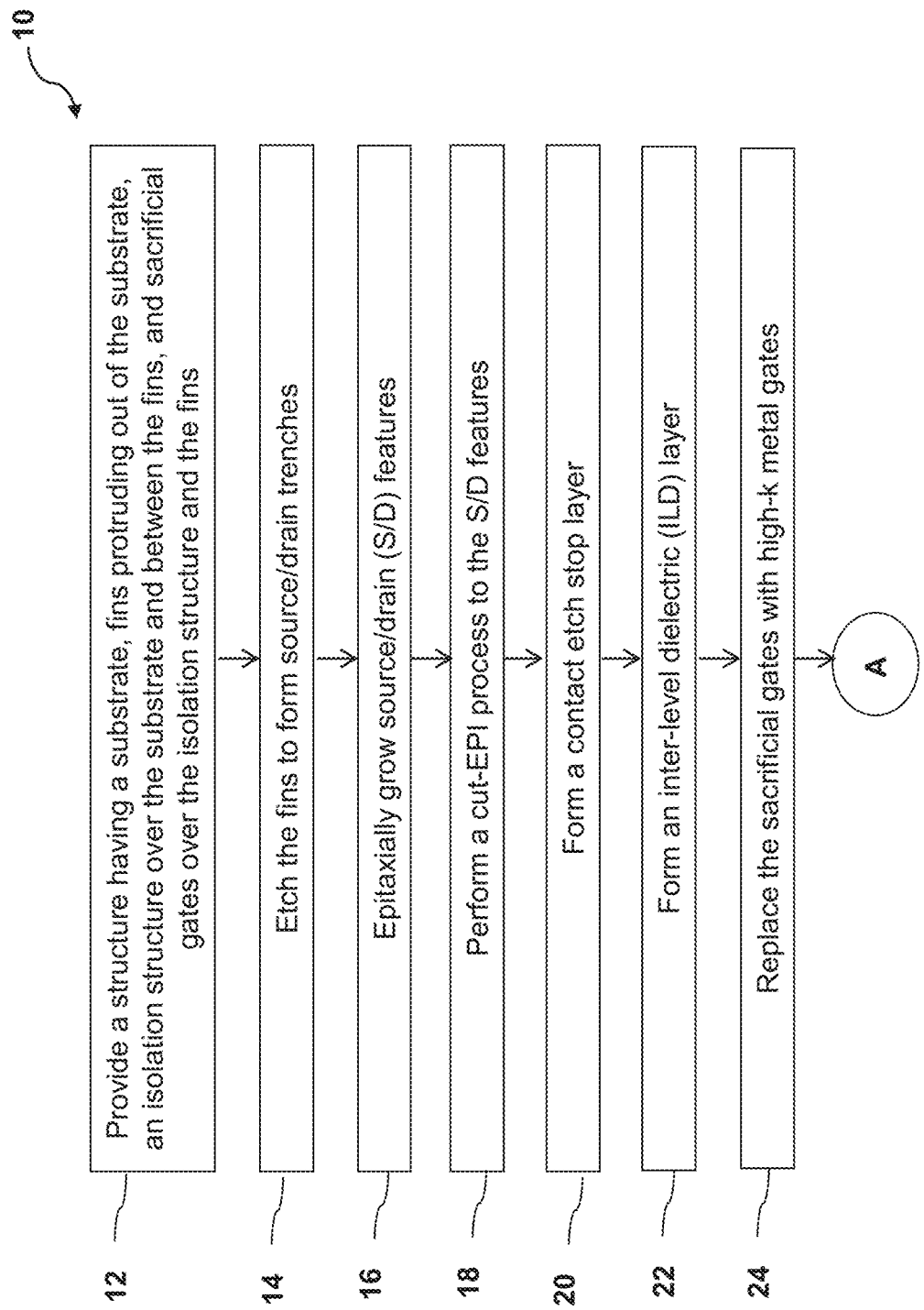
FIGS. 1A, 1B, and 1C show a flow chart of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−15% or other variations) of the number described, in accordance with the knowledge of the skilled in the art in view of the specific technology disclosed herein, unless otherwise specified. For example, the term "about 8 nm" may encompass the dimension range from 6.8 nm to 9.2 nm.

The present disclosure relates to a semiconductor fabrication process and the structure thereof, and more particularly to a process of cutting source/drain (S/D) epitaxial (EPI) features after EPI growth and before depositing a contact etch stop layer thereon. As the device scaling continues, EPI merging defects become more and more problematic. In S/D EPI engineering, large EPIs are generally desired for electrical performance considerations. However, large EPIs are prone to EPI merging defects where unrelated EPIs merge or contact each other accidentally. The general purposes of the present disclosure include applying a cut EPI (or cut-EPI) process to S/D EPI to prevent them from merging. With the disclosed process, the fins can be designed closer (or more densely) and the S/D EPI can be grown larger. Then, the cut-EPI process is applied to separate the S/D EPIs that should be separated in the final device. The disclosed process improves yield window, particularly for advanced process nodes.

Figure 1B:
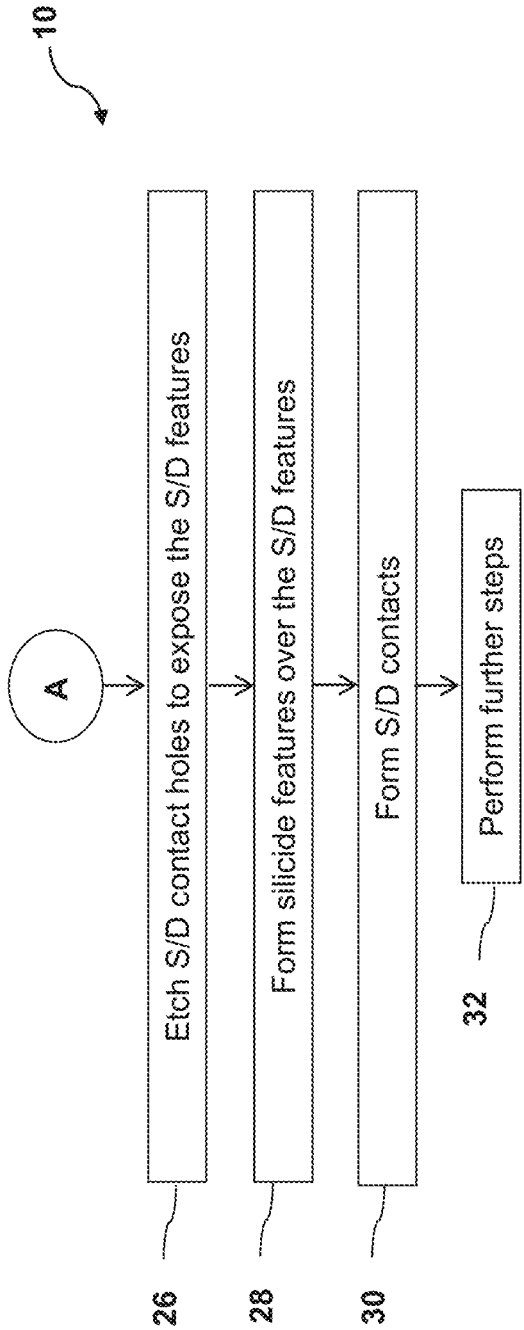
Figure 1C:
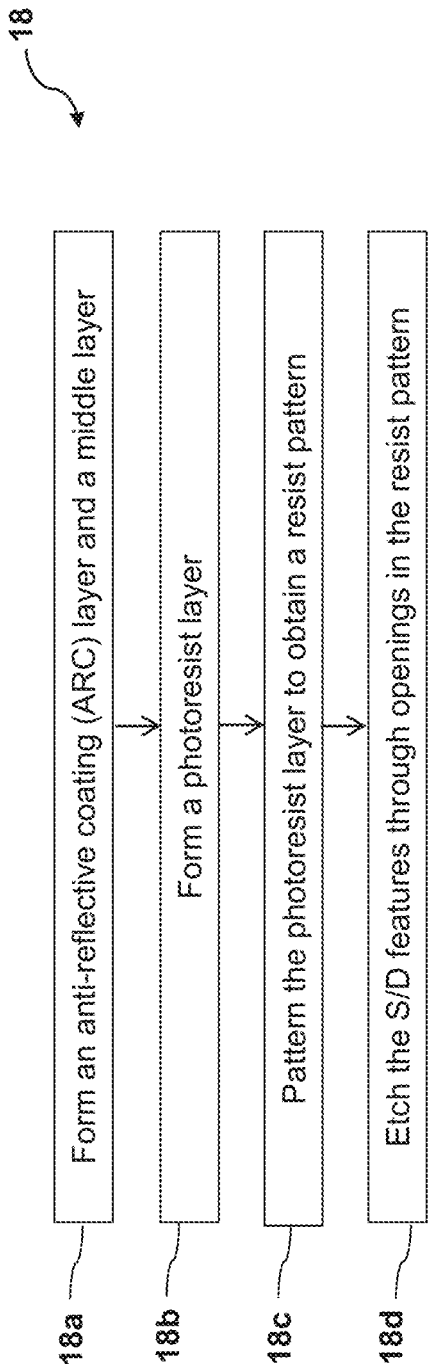

FIGS. 1A and 1B are a flow chart of a method 10 for fabricating a semiconductor device according to various aspects of the present disclosure. The method 10 is briefly described below. At operation 12, the method 10 provides or is provided with a structure that includes a substrate, fins protruding out of the substrate, an isolation structure over the substrate and between the fins, and sacrificial gates over the isolation structure and the fins. At operation 14, the method 10 etches the fins to form S/D trenches. At operation 16, the method 10 epitaxially grows S/D features (or S/D EPI) in the S/D trenches. Some of the S/D features may merge. At operation 18, the method 10 performs a cut process to the S/D features (a cut-EPI process). An embodiment of the operation 18 is shown in FIG. 1C. The cut-EPI process removes portions of the S/D features. It may separate S/D features that have merged at the operation 16 and/or increase spacing between neighboring S/D features regardless of whether they have merged or not. Also, the cut-EPI process applies an almost vertical etching (about 85 to 90 degrees) to the S/D features, with etch selectivity tuned to minimize the loss of the isolation structure and hard masks on the sacrificial gates. At operation 20, the method 10 forms a contact etch stop layer (CESL) on surfaces of the isolation structure and the S/D features. At operation 22, the method 10 forms an inter-level dielectric (ILD) layer over the CESL. At operation 24, the method 10 replaces the sacrificial gates with high-k metal gates. At operation 26, the method 10 etches S/D contact holes to expose the S/D features. At operation 28, the method 10 forms silicide features on exposed portions of the S/D features. At operation 30, the method 10 forms S/D contacts over the silicide features. The method 10 may perform further steps at operation 32 to complete the fabrication. Additional processing is contemplated by the present disclosure. Additional operations can be provided before, during, and after method 10, and some of the operations described can be moved, replaced, or eliminated for additional embodiments of method 10.

Embodiments of the method 10 can be applied to SRAM devices, logic devices, and other devices, particularly where EPI merging defects are of a concern. The cut EPI process can be applied to separate p-type S/D EPIs from each other and/or to separate n-type S/D EPIs from each other. Embodiments of the method 10 can be readily integrated into existing manufacturing flow to improve the S/D EPI quality and process robustness.

Method 10 is further described below in conjunction with FIGS. 2A-13 that illustrate various top, perspective, and cross-sectional views of a semiconductor device 100 at various steps of fabrication according to the method 10, in accordance with some embodiments. In some embodiments, the device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device 100 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-13 have been simplified for the sake of clarity to better understand the inventive concepts of the present disclosure. Additional features can be added in the device 100, and some of the features described below can be replaced, modified, or eliminated in other embodiments of the device 100.

Figure 2A:
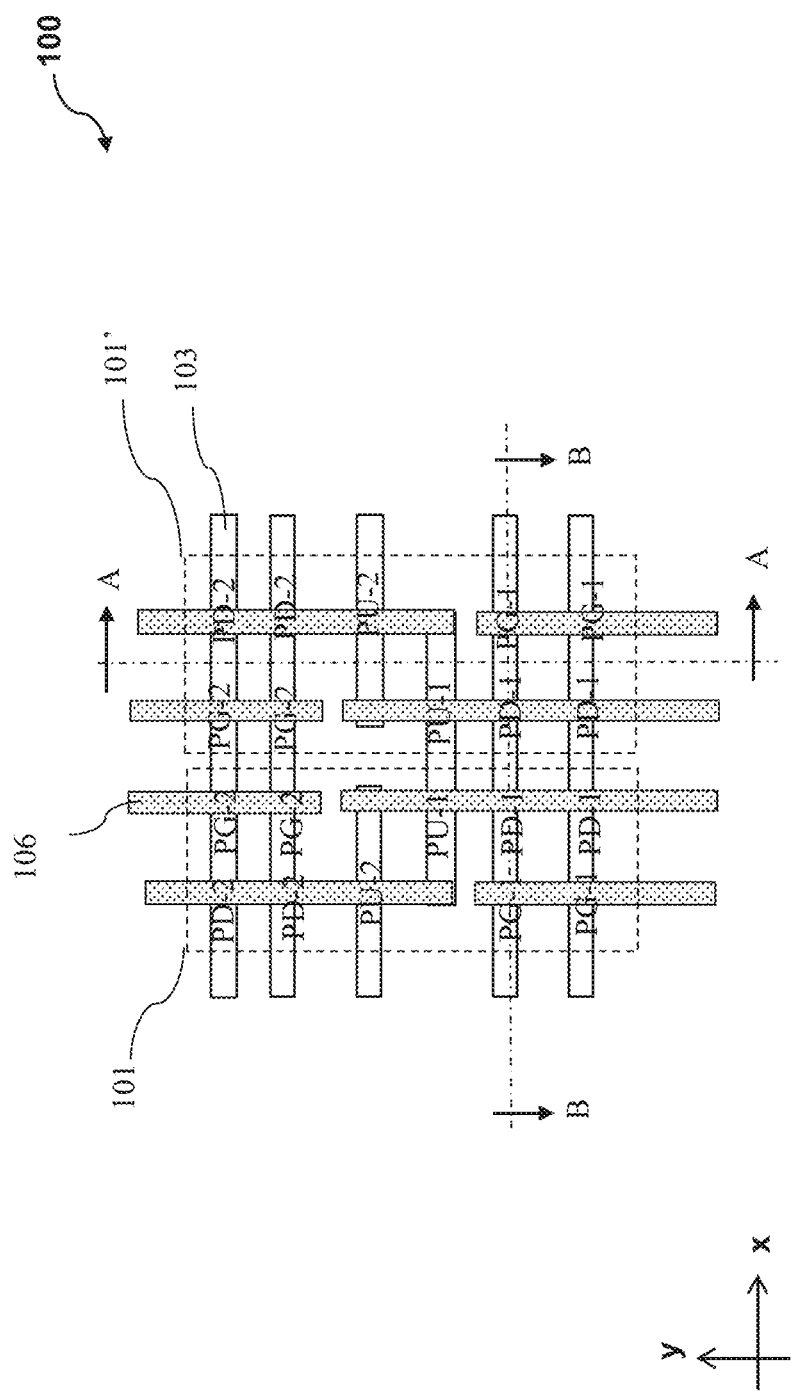
FIGS. 2A and 2B illustrate a top view and a perspective view of a portion of a semiconductor device in an intermediate step of fabrication according to an embodiment of the method of FIG. 1.
Figures 1, 2, 2A:
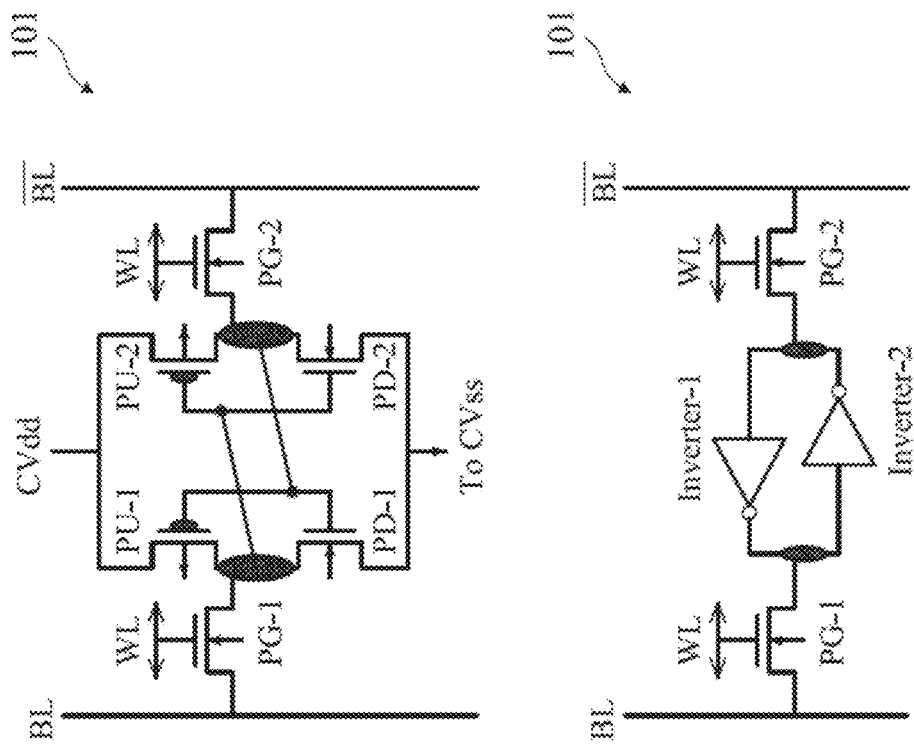
Figure 2B:
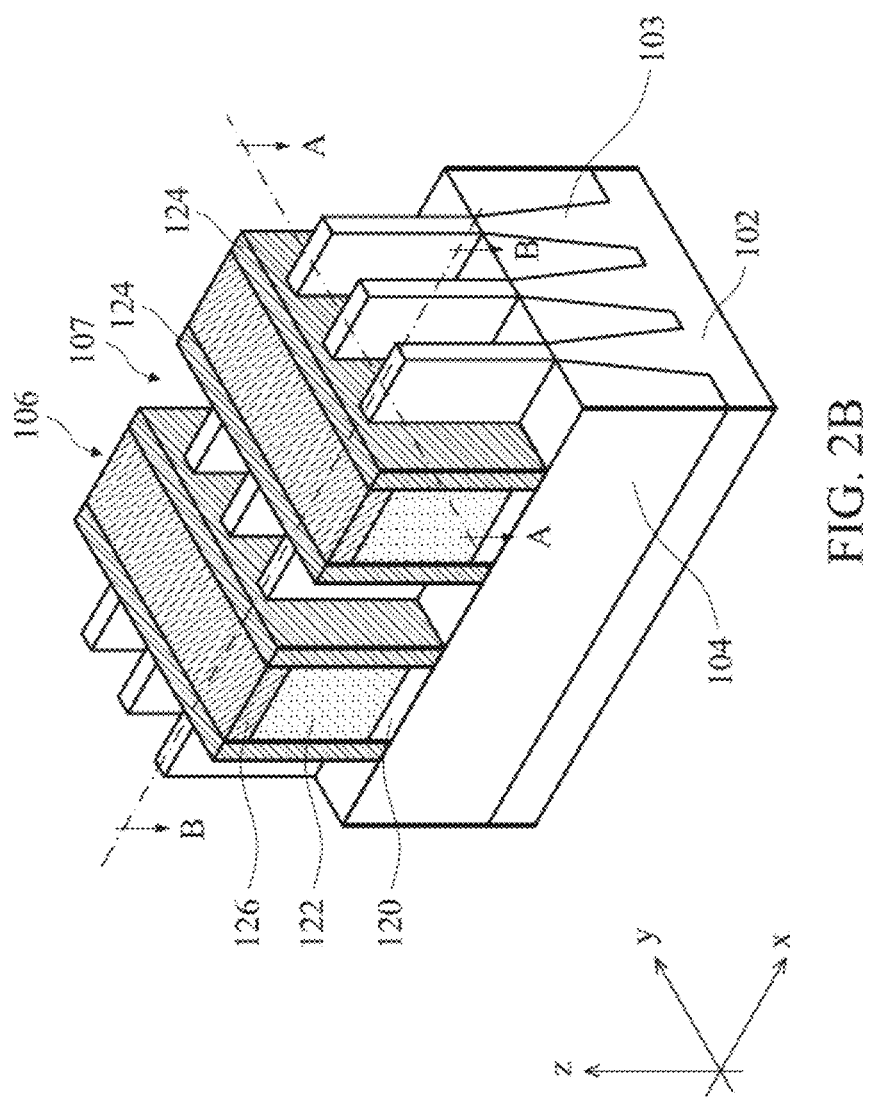
Figures 1, 2C:
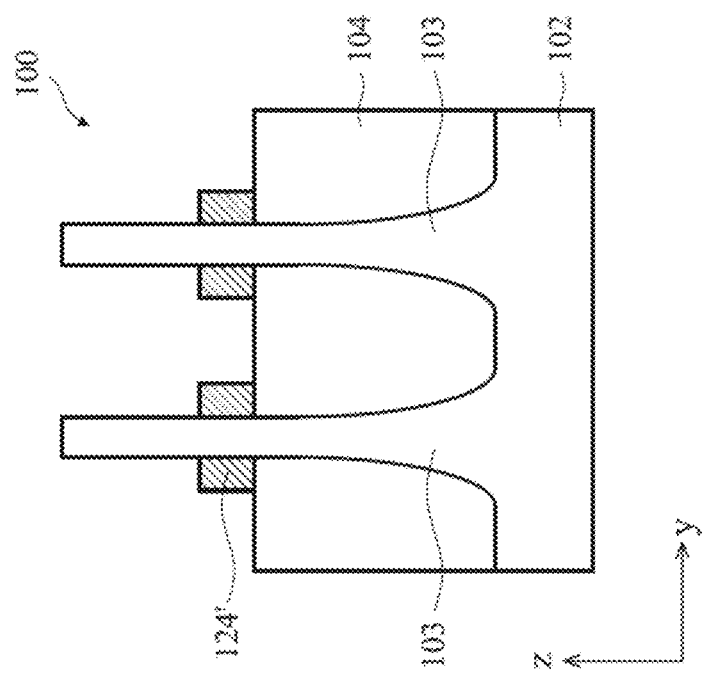
Figure 2C:
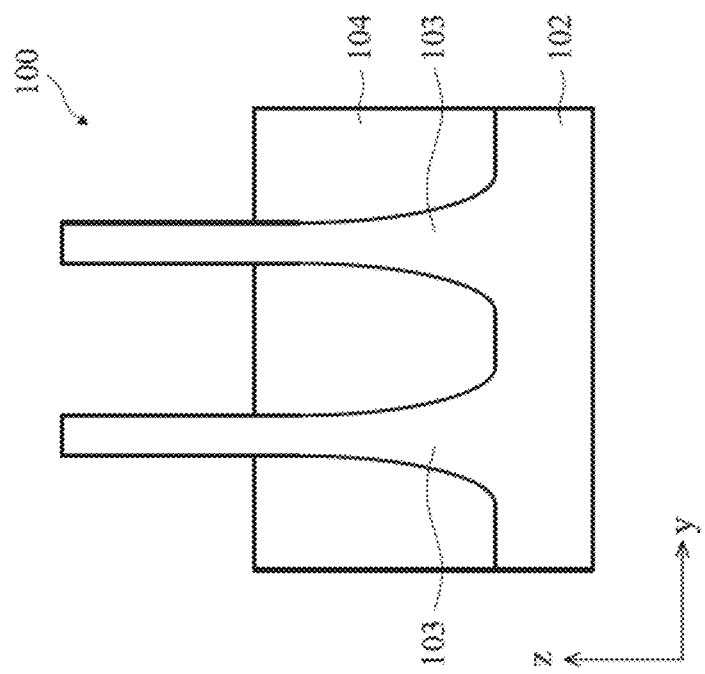
FIG. 2C illustrates a cross-sectional view of a portion of a semiconductor device along the A-A line in FIGS. 2A and 2B, according to an embodiment.
Figure 2D:
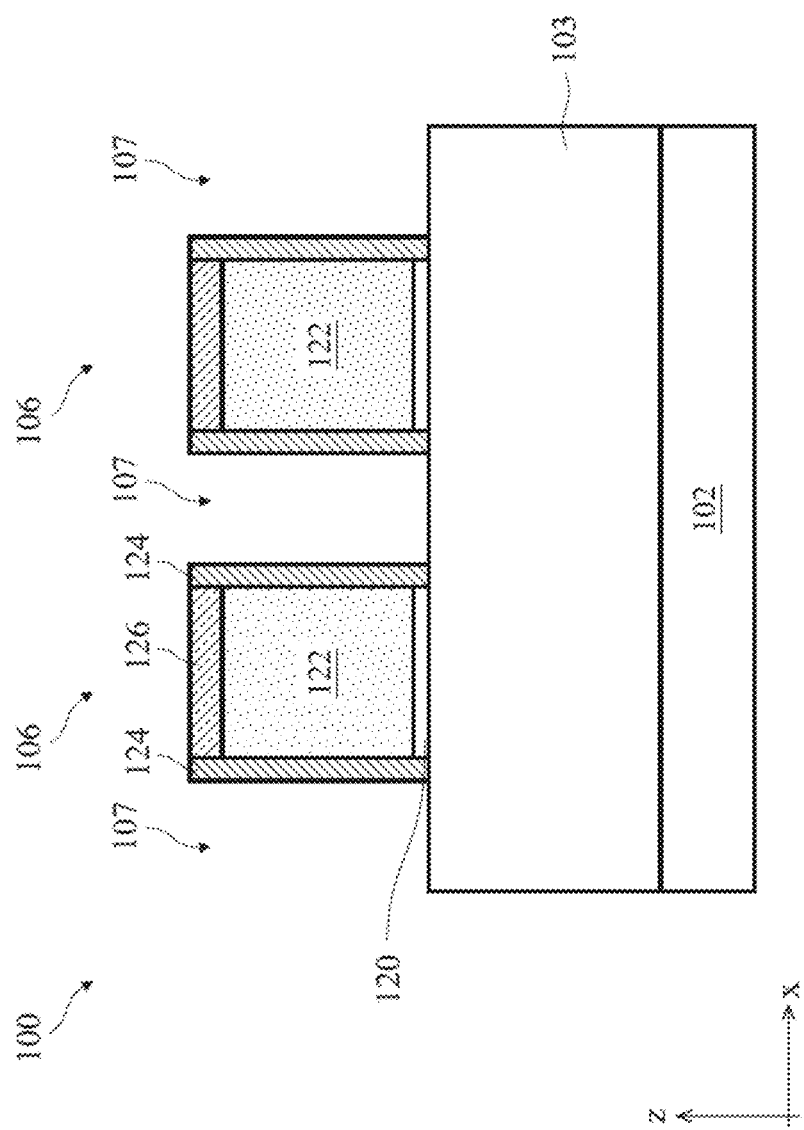
FIG. 2D illustrates a cross-sectional view of a portion of a semiconductor device along the B-B line in FIGS. 2A and 2B, according to an embodiment.

At operation 12, the method 10 (FIG. 1A) provides a structure of the device 100, an embodiment of which is illustrated in FIGS. 2A, 2B, 2C, and 2D. Particularly, FIGS. 2A and 2B illustrate a top view and a perspective view, respectively, of a portion of the device 100 according to an embodiment; FIG. 2C illustrates a cross-sectional view of a portion of the device 100 along the A-A line in FIGS. 2A and 2B, according to an embodiment; and FIG. 2D illustrates a cross-sectional view of a portion of the device 100 along the B-B line in FIGS. 2A and 2B, according to an embodiment. FIG. 2C-1 illustrates a cross-sectional view of a portion of the device 100 along the A-A line in FIGS. 2A and 2B, according to another embodiment.

Referring to FIG. 2A, the device 100 includes active regions 103 oriented lengthwise along an "x" direction and gate stacks (or gate structures) 106 oriented lengthwise along a "y" direction that is generally perpendicular to the "x" direction. In the present embodiment, the active regions 103 are semiconductor fins. Hereinafter the active regions 103 are also referred to as semiconductor fins 103 or fins 103. Further, in the present embodiment, the gate stacks 106 are sacrificial (or dummy) gate stacks that will be replaced with functional gate stacks during a later operation of the method 100. In the present embodiment, some of the fins 103 and the functional gate stacks that replace the gate stacks 106 form part of SRAM cells (or bits). For example, FIG. 2A illustrates two SRAM cells 101 and 101'. Each of the SRAM cell 101 and 101' has 10 transistors including two pullup (PU) transistors (PU-1 and PU-2), four pulldown (PD) transistors (two PD-1 and two PD-2), and four pass gate (PG) transistors (two PG-1 and two PG-2). As shown in FIG. 2A-1, the PU-1 and PD-1 transistors are coupled to form an inverter (Inverter-1 in FIG. 2A-2), and the PU-2 and PD-2 transistors are coupled to form another inverter (Inverter-2 in FIG. 2A-2). The inverters, Inverter-1 and Inverter-2, are cross-coupled to form a storage unit of the SRAM cell 101. FIG. 2A-2 further shows word line (WL), bit line (BL), and bit line bar ($\overline{BL}$) for accessing the storage unit of the SRAM cell 101. The WL, BL, and $\overline{BL}$ are not shown in FIG. 2A. The demand for more SRAM cells in an IC has been high and efforts have been taken to increase the SRAM cell density, for example, by reducing the pitches of the fins 103 and/or the gate stacks 106. However, issues arise in the source/drain epitaxial growth on the densely packed fins 103. On the one hand, having large epitaxial S/D features is generally desirable for increasing device performance. On the other hand, large S/D features may merge and cause short circuit defects. This issue is particularly noticeable for SRAM circuits, but also exists in other circuits. Embodiments of the present disclosure seek to solve this issue. Embodiments of the present disclosure can be applied to SRAM circuits, logic circuits, and other types of circuits. Further, embodiments of the present disclosure can be applied to 10-T SRAM cells like that shown in FIG. 2A, as well as other types of SRAM cells such as 6-T SRAM, 8-T SRAM, single port SRAM, dual port SRAM, and other memory configurations.

Referring to FIGS. 2A-2D collectively, the device 100 includes a substrate 102, over which the fins 103 and the sacrificial gate stacks 106 are formed. The device 100 includes an isolation structure 104 for isolating the fins 103. The fins 103 extend from the substrate 102 and above the isolation structure 104. The sacrificial gate stacks 106 are disposed above the isolation structure 104 and on three sides of every fin 103. Each of the sacrificial gate stacks 106 includes a sacrificial gate dielectric layer 120, a sacrificial gate electrode layer 122 over the sacrificial gate dielectric layer 120, and a hard mask layer 126 over the sacrificial gate electrode layer 122. The device 100 further includes gate spacers 124 on sidewalls of the sacrificial gate stacks 106 and on some sidewalls of the fins 103. In some embodiments as illustrated in FIG. 2C-1, the device 100 further includes fin sidewall spacers 124' that are disposed on sidewalls of the fins 103 and above the isolation structure 104. The fin sidewall spacers 124' may include the same material(s) as the gate spacers 124. The various features (or components) of the device 100 are further described below.

The substrate 102 is a silicon (Si) substrate in the present embodiment, such as a silicon wafer. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 103 may include one or more layers of semiconductor materials such as silicon or silicon germanium. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable. In some embodiment where the device 100 includes gate-all-around transistors such as nanosheet devices or nanowire devices, the fins 103 include multiple layers of semiconductor materials that are vertically and alternately stacked (along the "z" direction), such as having layers of silicon and layers of silicon germanium alternately stacked.

The isolation structure 104 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 104 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 104. Other types of isolation structure may also be suitable, such as field oxide and LOCal Oxidation of Silicon (LOCOS). The isolation structure 104 may include a multi-layer structure, for example, having one or more liner layers (e.g., silicon nitride) on surfaces of the substrate 102 and the fins 103 and a main isolating layer (e.g., silicon dioxide) over the one or more liner layers.

The sacrificial gate dielectric layer 120 may include a dielectric material such as silicon oxide (e.g., $SiO_2$) or silicon oxynitride (e.g., SiON), and may be formed by chemical oxidation, thermal oxidation, atomic layer deposition (ALD), CVD, and/or other suitable methods. The sacrificial gate electrode layer 122 may include poly-crystalline silicon (poly-Si) or other material(s) and may be formed by suitable deposition processes such as low-pressure chemical vapor deposition (LPCVD) and plasma-enhanced CVD (PECVD). The hard mask layer 126 may include one or more layers of dielectric material such as silicon oxide and/or silicon nitride and may be formed by CVD or other suitable methods. The various layers 120, 122, and 126 may be patterned by photolithography and etching processes. The gate spacers 124 (and the optional fin sidewall spacers 124') may comprise a dielectric material, such as silicon oxide, silicon nitride, silicon oxynitride, silicon carbide, other dielectric material, or combinations thereof, and may comprise one or multiple layers of material. The gate spacers 124 may be formed by depositing a spacer material as a blanket over the isolation structure 104, the fins 103, and the sacrificial gate stacks 106. Then the spacer material is etched by an anisotropic etching process to expose the isolation structure 104, the hard mask layer 126, and a top surface of the fins 103. Portions of the spacer material on the sidewalls of the sacrificial gate stacks 106 become the gate spacers 124. Adjacent gate spacers 124 provide openings 107 that expose portions of the fins 103 in the S/D regions of the device 100.

At operation 14, the method 10 (FIG. 1A) etches the fins 103 to form S/D trenches 105, such as shown in FIG. 3. Operation 14 may include one or more photolithography process and etching processes. For example, the photolithography process may form a masking element covering areas of the device 100 that are not to be etched. The masking element provides openings through which the fins 103 are etched. In an embodiment, the etching process may include dry etching, wet etching, reactive ion etching (RIE), and/or other suitable processes, as discussed earlier. Further, the etching process is tuned selective to the materials of the fins 103, and with no (or minimal) etching to the gate spacers 124, the hard mask layer 126, and the isolation structure 104. In the embodiment depicted in FIG. 3, the etching process recesses the fins 103 until a top surface of the fins 103 falls below a top surface of the isolation structure 104. After the etching process, a cleaning process may be performed that cleans the trenches 105 with a cleaning chemical to make the various surfaces therein ready for a subsequent epitaxial growth process. The cleaning chemical may be a hydrofluoric acid (HF) solution, a diluted HF solution, or other suitable cleaning solutions.

At operation 16, the method 10 (FIG. 1A) epitaxially grows S/D features 108 in the S/D trenches 105, such as shown in FIG. 4. The epitaxial S/D features 108 fill the respective trenches 105 and further grow out of the trenches 105. In embodiments where the device 100 includes the fin sidewall spacers 124', the height of the fin sidewall spacers 124' can be used to promote the growth of the epitaxial features 108 to a desirable height before any lateral growth. Once growing out of the trenches 105 (or out of the fin sidewall spacers 124'), the S/D features 108 expand vertically and laterally due to different growth rates of different crystalline facets. For example, the growth rate of crystalline silicon is different along different crystalline directions (e.g., the [100], [111], and [110] directions of silicon crystal). The growth rate of silicon germanium crystal is also different along different crystalline directions. The epitaxial growth process may be a LPCVD process with a silicon-based precursor, a selective epitaxial growth (SEG) process, or a cyclic deposition and etching (CDE) process. For example, silicon crystal may be grown with LPCVD with dichlorosilane ($SiH_2Cl_2$) as the precursor. For another example, silicon germanium crystal may be formed with a CDE process using HCl as the etching gas and a gas mixture of $GeH_4$ and $H_2$ as the deposition gas which may contain about 1% to about 10% $GeH_4$ in $H_2$. The epitaxial features 108 include a semiconductor material suitable for forming raised S/D features. In an embodiment, the epitaxial features 108 include silicon germanium (SiGe) doped with one or more p-type dopants, such as boron or indium. In another embodiment, the epitaxial features 108 include silicon doped with one or more n-type dopants, such as phosphorus or arsenic. The doping may be performed in-situ or ex-situ with the epitaxial growth process. Further, the S/D features 108 may be grown with multiple layers with different dopant concentrations. In the present embodiment, the S/D features 108 includes three layers 108a, 108b, and 108c. The layer 108a (the outer layer) is over the layer 108b (the inner layer), and the layer 108c (the top layer) is over both the layers 108a and 108b. In an embodiment, the inner layer 108b is doped with a higher dopant concentration than the outer layer 108a and the top layer 108c. The top layer 108c may provide loading areas for S/D contacts. In an embodiment for p-type S/D features 108, the inner layer 108b contains a higher Ge content (atomic %) and a higher dopant concentration than the outer layer 108a and the top layer 108c.

It is generally desirable to grow the S/D features 108 to have a large volume. For example, this may increase the conductivity of the S/D electrodes and increase S/D contact areas. However, as device down-scaling continues and the spacing between neighboring fins 103 shrinks, it becomes more and more difficult to grow large S/D features 108 without touching neighboring S/D features 108. For example, in the embodiment depicted in FIG. 4, the two S/D features 108 are large enough to contact each other (or to merge) during the epitaxial growth. In some instances, this merging is intended and beneficial—for example, the source (or drain) electrodes of the two transistors are shared source (or drain) in the device 100. In these instances, the two S/D features 108 may stay merged in the subsequent fabrication steps. However, in some other instances, this merging is unintended and leaving the merged S/D features 108 in the final structure would cause short circuit defects. Embodiments of the method 10 include a cut-EPI process to separate those merged S/D features 108 that should stay separated in the final structure of the device 100, as further discussed below. The cut-EPI process also partially removes those S/D features 108 that are close but not merged, thereby increasing the spacing among them. This may increase the process window for S/D contact formation and/or increase the devices' long-term reliability. Further, by applying the cut-EPI process, fins 103 may be placed more densely than designs that do not use the cut-EPI process. As discussed earlier, having more densely packed fins 103 leads to higher circuit density, which is highly desirable for today's IC designers and manufacturers.

At operation 18, the method 10 (FIG. 1A) performs a cut-EPI process to the S/D features 108. The cut-EPI process may include a variety of processes such as deposition, photolithography, and etching. An embodiment of the cut-EPI process is shown in FIG. 1C that includes sub-operations 18a, 18b, 18c, and 18d. Additional sub-operations can be provided before, during, and after those shown in FIG. 1C, and some of the sub-operations described can be moved, replaced, or eliminated for additional embodiments of the operation 18.

Referring to FIG. 1C, the sub-operation 18a forms an anti-reflective coating (ARC) layer 110 over the device 100, such as depicted in FIG. 5A. The ARC layer 110 fills various trenches over the isolation structure 104 and the S/D features 108 and provides a planar top surface. The sub-operation 18a also forms a middle layer 111, such as a Si-rich hard mask layer, over the ARC layer 110. The sub-operation 18b forms a resist layer 112 over the middle layer 111, for example, by spin coating; and may further perform a pre-exposure baking process to the resist layer 112.

The sub-operation 18c (FIG. 1C) performs an exposure process to the resist layer 112 using a mask followed by a post-exposure baking process and a developing process. During the exposure process, the resist layer 112 is exposed to radiation energy (e.g., UV light, DUV light, or EUV light), where the mask blocks, transmits, and/or reflects radiation to the resist layer 112 depending on a mask pattern of the mask and/or mask type (e.g., binary mask, phase shift mask, or EUV mask), such that an image is projected onto the resist layer 112 that corresponds with the mask pattern. Since the resist layer 112 is sensitive to radiation energy, exposed portions of the resist layer 112 chemically change, and the exposed (or the non-exposed) portions of the resist layer 112 are dissolved during the developing process depending on characteristics of the resist layer 112 and characteristics of a developing solution used in the developing process. After development, the patterned resist layer 112 includes a resist pattern (referred to as resist pattern 112) that corresponds with the mask.

Figures 1, 5B:
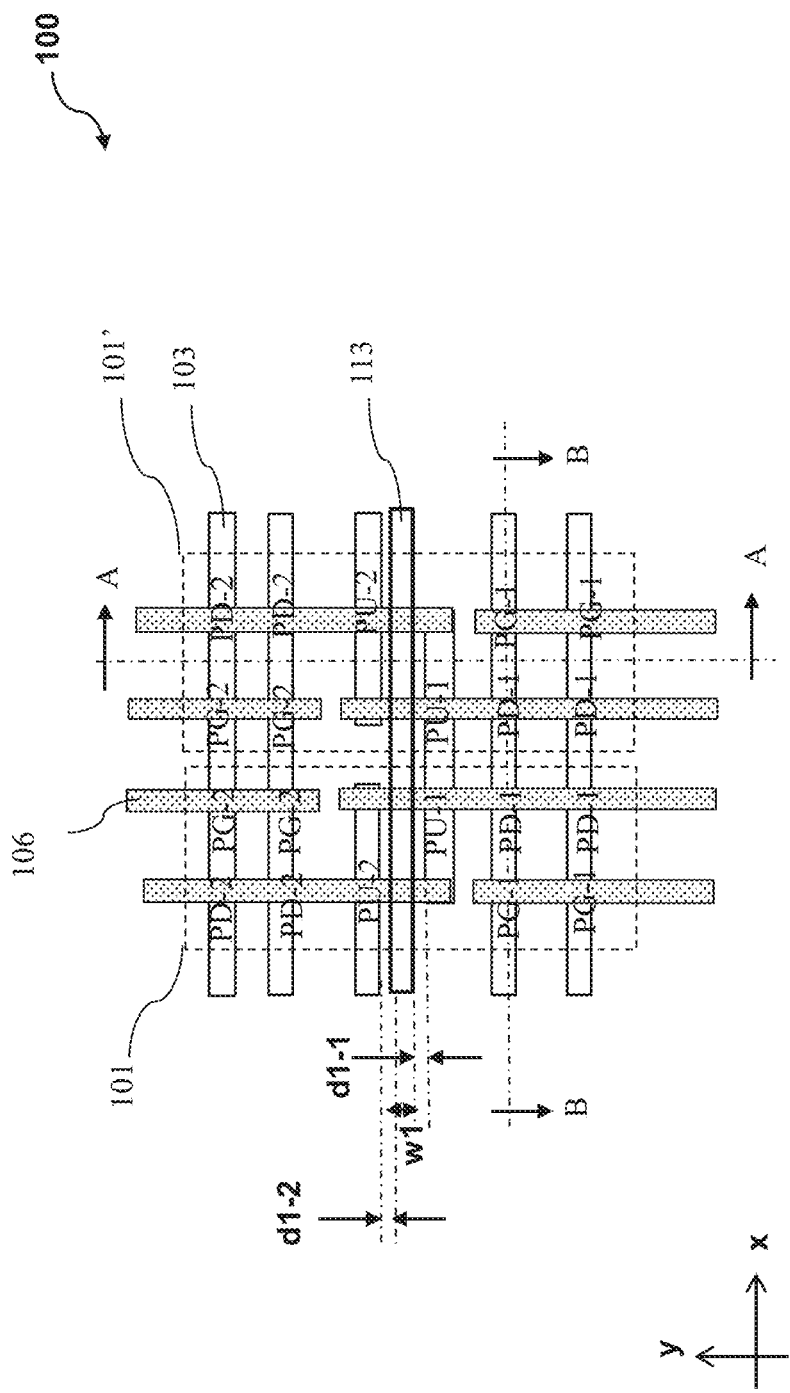

FIG. 5B and FIG. 5B-1 illustrate a cross-sectional view and a top view, respectively, of the device 100 with the ARC layer 110, the middle layer 111, and the resist pattern 112 in accordance with an embodiment. As depicted in FIG. 5B-1, the resist pattern 112 includes an opening 113 that is between two fins 103 and parallel with the two fins 103 from the top view. As depicted in FIGS. 5B and 5B-1, the opening 113 corresponds to an area directly above the merged S/D features 108. The mask portion of the resist pattern 112 covers areas of the device 100 that is not to be etched by the operation 18. In the present embodiment, the opening 113 is designed to cut epitaxial S/D features grown for PU-1 and PU-2 transistors in SRAM cells (refer to FIGS. 2A, 2A-1, and 2A-2 for the discussion of an SRAM cell embodiment). In other words, the opening 113 is designed to separate p-type epitaxial S/D features. S/D features of the same type (p-type or n-type) may be grown at the same time to improve process efficiency. For example, S/D features for p-type transistors such as the PU-1 and PU-2 transistors may be grown at the same time, and S/D features for n-type transistors such as the PD-1, PD-2, PG-1, and PG-2 transistors may be grown at the same time. Thus, S/D features of the same type may be subject to merging during epitaxial growth processes. For the n-type transistors in the depicted embodiment, merging of the S/D features is not an issue but rather desirable for increasing device performance. For example, the two PG-1 transistors in the SRAM cell 101 (or the SRAM cell 101') may have their S/D features merged. Same is true for the two PG-2 transistors, the two PD-1 transistors, and the two PD-2 transistors in each of the SRAM cells 101 and 101'. For the p-type transistors PU-1 and PU-2 in the depicted embodiment, merging of the S/D features thereof would cause defects. Thus, the present embodiment applies the cut-EPI process to separate the S/D features on the PU-1 and PU-2 transistors.

In some embodiments, the width w1 of the opening 113 (along the "y" direction) is less than or equal to the space between the two adjacent fins 103. If the width w1 is greater than the space between the two adjacent fins 103, the cut-EPI process may remove too much S/D features. In some embodiments when the width w1 is smaller than the space between the two adjacent fins 103, the opening 113 is placed as close to equidistance to the two adjacent fins 103 as possible so that the S/D features on PU-1 and PU-2 may provide matching performance. In some embodiment, the distance d1-1 between the edge of the opening 113 to the edge of the fins 103 for the PU-1 transistor and the distance d1-2 between the edge of the opening 113 to the edge of the fins 103 for PU-2 transistors may be about the same, for example, within +/−10% difference with respect to each other. In designs where matching performance between the S/D features to be cut is not required, the distance d1-1 and d1-2 may have a larger difference therebetween. In some embodiments, each of the distance d1-1 and d1-2 is designed to be larger than about 5 nm to about 8 nm to allow for sufficient margin for etching processes, the width w1 is designed to be larger than about 20 nm to allow for sufficient margin for photolithography, and the total of d1-1, d1-2, and w1 is equal to the space between the two adjacent fins 103. The present disclosure contemplates the resist pattern 112 to have other openings in addition to or in place of the opening 113. Further, the exposure process can be implemented or replaced by other methods, such as maskless lithography, e-beam writing, ion-beam writing, or combinations thereof.

The sub-operation 18d (FIG. 1C) etches the middle layer 111, the ARC layer 110 and the S/D features 108 through the opening(s) 113 in the resist pattern 112. FIG. 5C illustrates a resultant structure in an embodiment. In the present embodiment, the etching process is anisotropic (vertical or near-vertical) along the "z" direction. In the present disclosure, a "near-vertical" direction is a direction that is within +/−10 degrees (such as within +/−5 degrees) from the "z" direction (i.e., the normal to the top surface of the substrate 102). Using an anisotropic etching helps preserve the volume of the S/D features 108. In an embodiment, the etching process is an anisotropic dry etching process. For example, the dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etching process is tuned selective to the materials of the S/D features 108, the ARC layer 110, and the middle layer 111, and with no (or minimal) etching to the gate spacers 124, the hard mask layer 126, and the isolation structure 104. In some embodiments, the sub-operation 18d etches the ARC layer 110 and the S/D features 108 using different etching chemistries. For example, it may etch the ARC layer 110 first, using an etchant that is selective to the material(s) of the ARC layer 110 to expose the S/D features 108 in the opening 113. Subsequently, it etches the S/D features 108 through the opening 113 using another etchant that is selective to the material(s) of the S/D features 108. As a result of the anisotropic etching, each of the S/D features 108 that has been cut is provided with a vertical or near-vertical surface (or side) 114 (FIG. 5C). As disclosed earlier, a "near-vertical" direction is a direction that is within +/−10 degrees (such as within +/−5 degrees) from the "z" direction (i.e., the normal to the top surface of the substrate 102). Thus, a near-vertical surface 114 is a surface that is perpendicular to the top surface of the substrate 102 or a surface that forms an angle within +/−5 degrees with respect to a plane perpendicular to the top surface of the substrate 102. Particularly, the surfaces 114 on two adjacent S/D features 108 face (or oppose) each other along the "y" direction. As illustrated in FIG. 5C, other surfaces 115 of the S/D features 108 are generally sloped and are not vertical or near-vertical. Hence, the surfaces 115 (which are formed as natural growth facets of the EPI material) have a different profile than the surface 114 (which is formed by the cut-EPI process).

In some embodiment, the sub-operation 18d may also slightly etch into the isolation structure 104, such as depicted in FIG. 5C-1. Referring to FIG. 5C-1, the area of the isolation structure 104 between the two S/D features 108 is also etched to result in a dip 104a. The dip 104a may appear as a U-shape or a curved shape in this cross-sectional view. The dip 104a extends into the isolation structure 104 by a depth h2 along the "z" direction. In some embodiments, the depth h2 is in a range of about 5 nm to about 20 nm. Having the dip 104a is an indication that the epitaxial features 108 is sufficiently cut. Also shown in FIG. 5C-1, the epitaxial feature 108 has a height h1 along the "z" direction. In some embodiments, the height h1 is in a range of about 45 nm to about 65 nm.

Figure 5D:
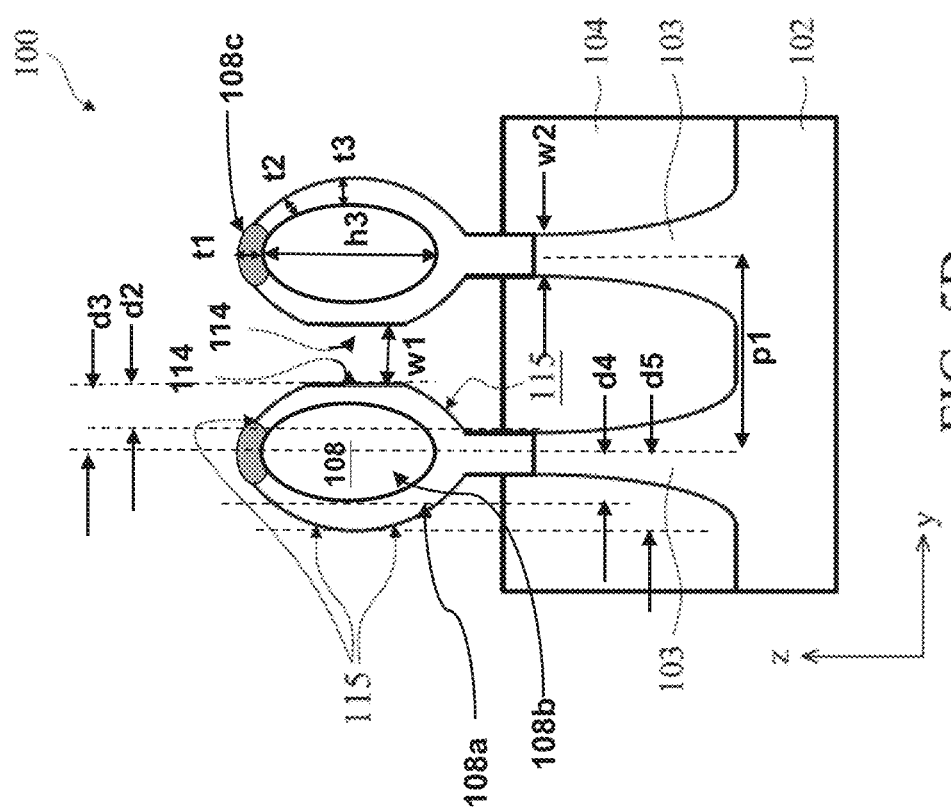

After the etching is completed, the sub-operation 18d removes the resist pattern 112, the middle layer 111, and the ARC layer 110 from the device 100, for example, using resist stripping, ashing, or other suitable process, which is selective to the resist pattern 112, the middle layer 111, and the ARC layer 110. FIG. 5D illustrates a cross-sectional view of the device 100 after the operation 18 completes, in accordance with an embodiment. As depicted in FIG. 5D, each of the two S/D features 108 is cut (and partially removed) and is provided with a vertical or near-vertical surface 114. Each of the S/D features 108 further includes other surfaces 115 that are more gently sloped than the surface 114. The surfaces 115 are also referred to as sloped surfaces 115. Some of the sloped surfaces 115 and the surface 114 are on opposing sides of the fin 103 where the respective source/drain feature 108 is grown. Further, the surface 114 is connected to the top point and bottom surface of the S/D feature 108 through the surfaces 115. The two surfaces 114 on the two S/D features 108 face each other along the "y" direction and are separated by a distance that is approximately equal to the width w1 of the opening 113 discussed above with reference to FIG. 5B-1. The distance d2 between the surface 114 and the nearest edge of the fin 103 is approximately equal to the distance d1-1 or d1-2 discussed above with reference to FIG. 5B-1. Further, there is a distance d3 between the surface 114 and the center line of the fin 103. In various embodiments, a ratio of d2 to d3 is in a range of about ½ to about ¾ such as from about 5/7 to about ⅔. A larger ratio indicates that the cut is farther away from the edge of the fin 103. If the ratio is too small (for example, less than ½), too much of the epitaxial feature 108 has been removed unnecessarily and the remaining epitaxial feature 108 may not provide good performance. If the ratio is too big (for example, greater than ¾), the cut may have been insufficient and epitaxial merging defects may still exist. In some embodiments, the total of w1 and 2xd3 is equal to the centerline to centerline pitch, p1, of the fins 103. In some embodiments, a ratio of the width of fin, w2, to the pitch p1 is in a range of about 4 to about 6. Due to the cut-EPI process, the ratio of w2 to p1 is greater than that in other designs which do not use the cut-EPI process. In other words, using the cut-EPI process increases the fin density in the present embodiment.

As shown in FIG. 5D and as discussed earlier with reference to FIG. 4, the epitaxial feature 108 in the present embodiment is formed with an outer layer 108a over an inner layer 108b, and a top layer 108c over both the layers 108a and 108b and may include other layers not specifically shown. The inner layer 108b includes a higher dopant concentration than the outer layer 108a. The top layer 108c has a thickness t1 at the top of the epitaxial feature 108 (along the "z" direction). The outer layer 108a has a thickness t2 at the sloped sidewall 115 of the epitaxial layer 108 (along the 45° direction in the y-z plane), and a thickness t3 at the widest part of the epitaxial layer 108. In an embodiment, each of the thicknesses t1, t2, and t3 may be in a range of about 2 nm to about 4 nm. Further, the thickness t2 may be greater than both the thicknesses t1 and t3 in some embodiments. The inner layer 108b has a height h3 along the "z" direction aligned with the centerline of the fin 103. In some embodiments, the height h3 may be in a range of about 30 nm to about 40 nm. Further, in some embodiment, a ratio of t1 to h3 is in a range of about 1/15 to about 1/10. If the ratio is too small (i.e., the top layer 108c is too thin), the top layer 108c may not have enough volume to sustain subsequent etching process when forming S/D contacts. If the ratio is too big, the total S/D resistance may be too large in some instances because the top layer 108c has a lower dopant concentration than the inner layer 108b and may also contain a lower Ge concentration than the inner layer 108b when the S/D feature is of p-type. The inner layer 108b extends horizontally to a distance d4 from the centerline of the fin 103, and the outer layer 108a extends horizontally to a distance d5 from the centerline of the fin 103. In an embodiment, both d4 and d5 are greater than d3 due to the cut-EPI process. Further, each of the distance d4 and d5 may be greater than half the fin pitch p1 to achieve an overall large epitaxial feature. Due the cut-EPI process, there is no risk of causing epitaxial merging defects.

Figures 1, 6:
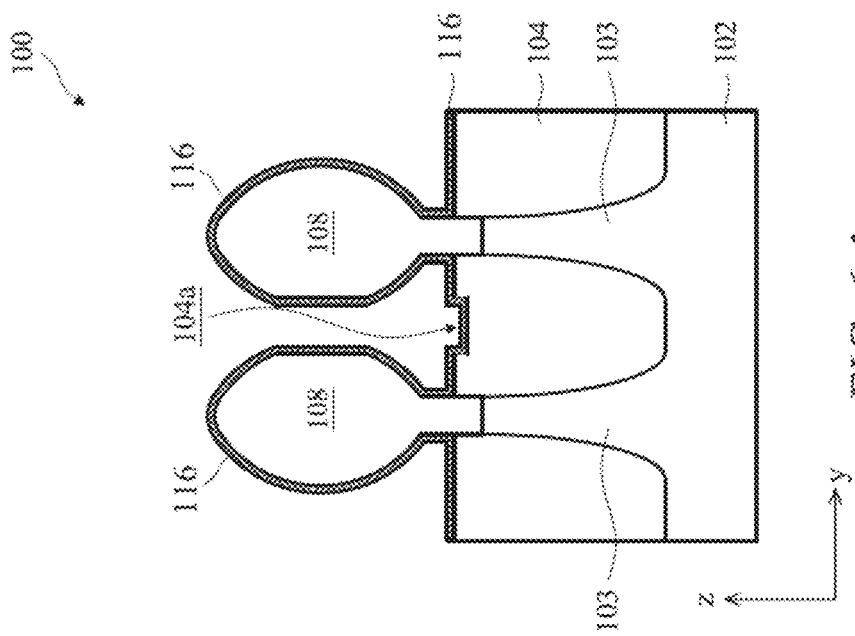
Figure 6:
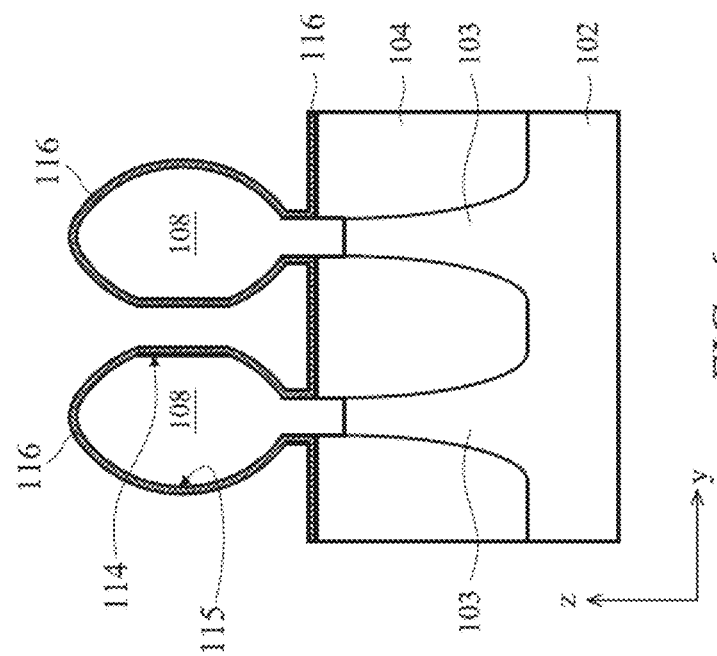

At operation 20, the method 10 (FIG. 1A) forms a contact etch stop layer (CESL) 116 over the various surfaces of the isolation structure 104, the S/D features 108, the gate spacers 124, and the sacrificial gate stacks 106. As depicted in FIG. 6 (for simplicity, the various layers of the S/D features 108 are not illustrated), the CESL 116 is formed over the top surface of the isolation structure 104 and over the surfaces 114 and 115 of the S/D features 108. In an alternative embodiment where the cut-EPI process results in a dip 104a in the top surface of the isolation structure 104, such as shown in FIG. 5C-1, the CESL 116 is also deposited over the top surface of the dip 104a, such as depicted in FIG. 6-1. The CESL 116 may comprise silicon nitride, silicon oxynitride, silicon nitride with oxygen (O) or carbon (C) elements, and/or other materials; and may be formed by CVD, PVD, ALD, or other suitable methods. In an embodiment, the CESL 116 is deposited to a substantially uniform thickness along the various surfaces discussed above.

Figure 7:
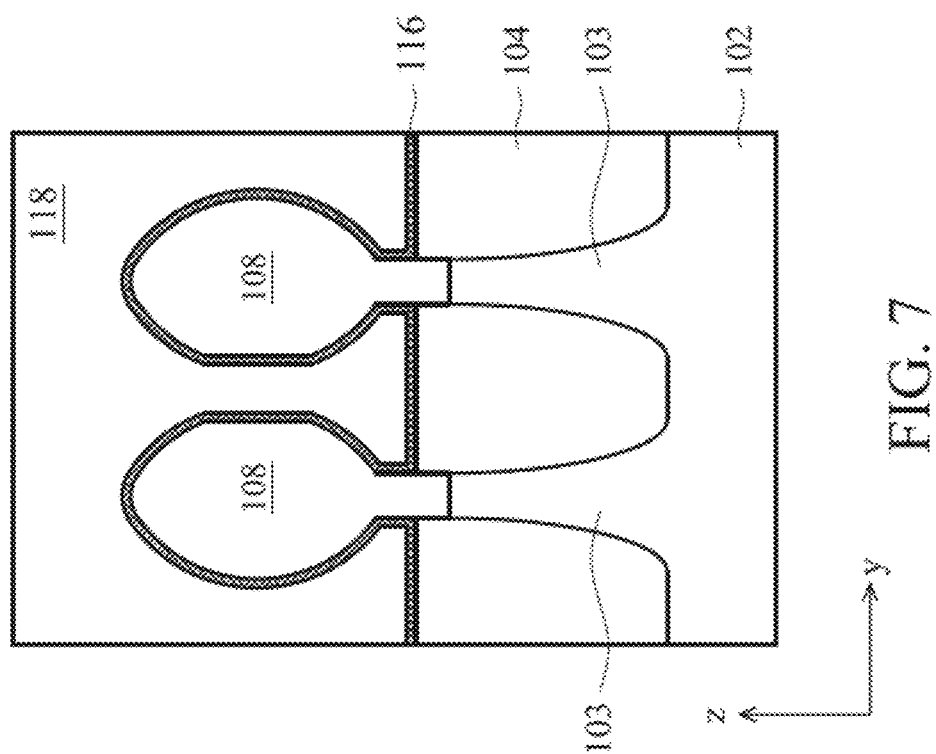

At operation 22, the method 10 (FIG. 1A) forms an inter-level dielectric (ILD) layer 118 over the CESL 116, such as depicted in FIG. 7 according to an embodiment. The ILD layer 118 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD layer 118 may be formed by PECVD (plasma enhanced CVD), FCVD (flowable CVD), or other suitable methods. The ILD layer 118 fills the various trenches between the sacrificial gate stacks 106 and between the S/D features 108.

Figure 8A:
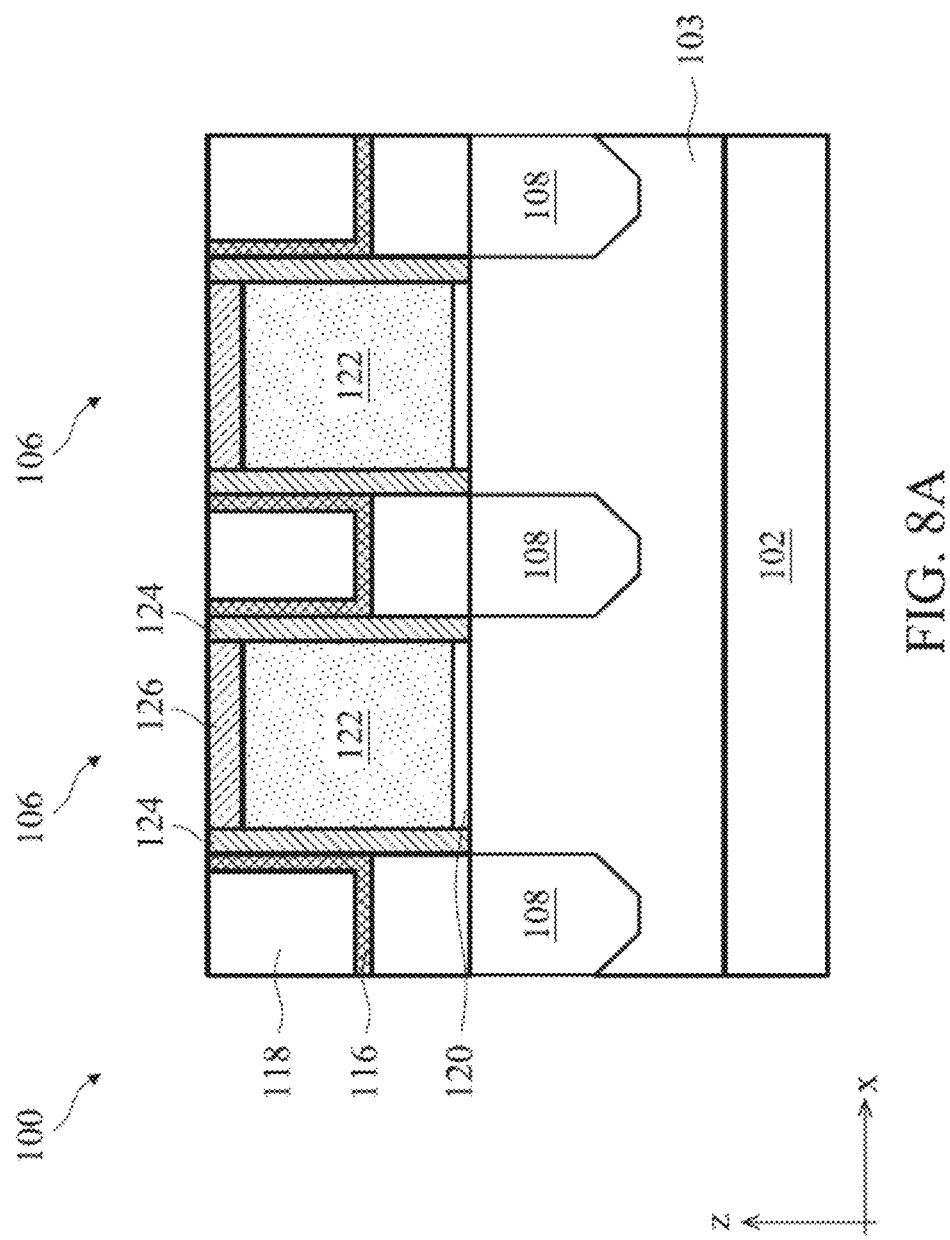
Figure 8B:
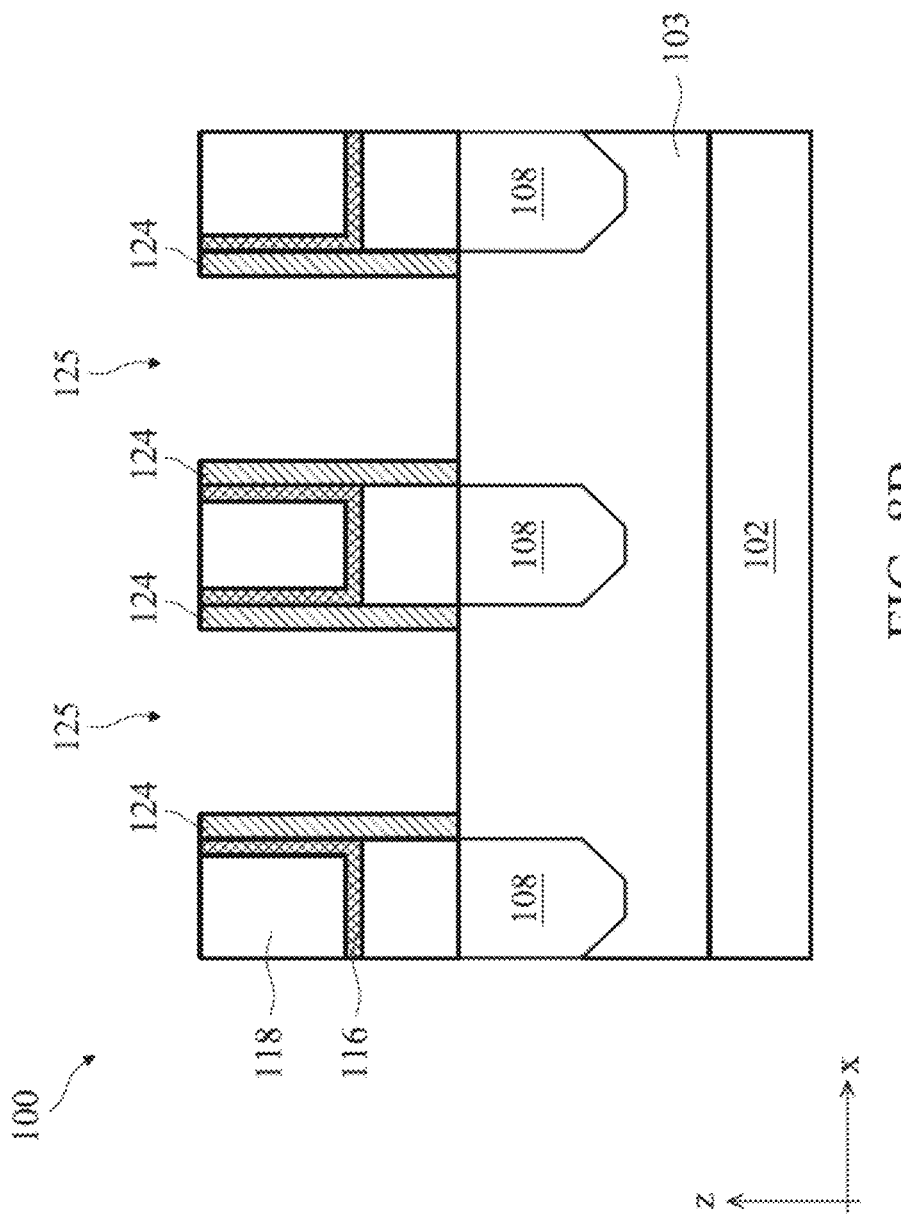
Figure 8C:
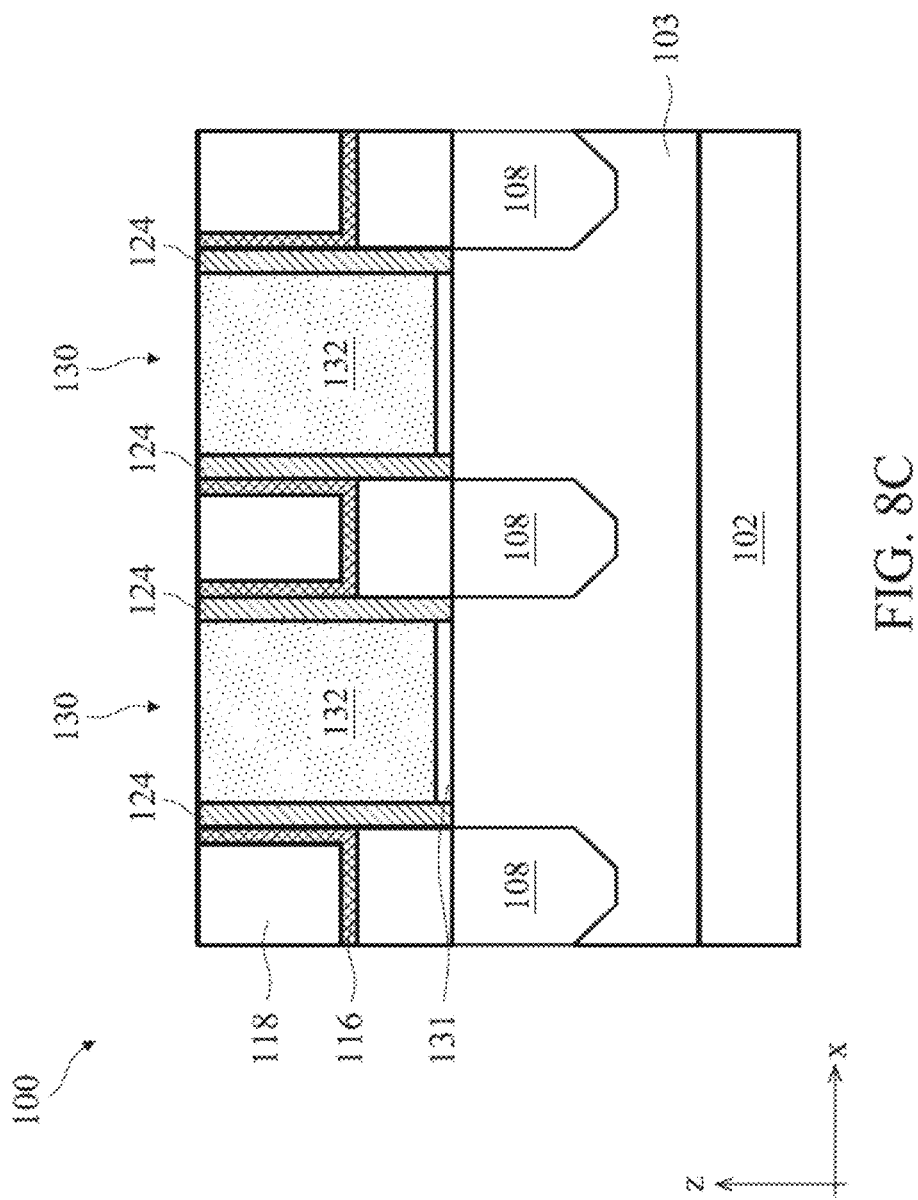

At operation 24, the method 10 (FIG. 1A) replaces the sacrificial gate stacks 106 with functional gate stacks 130. This is referred to as a gate replacement process (or replacement gate process). An embodiment of the gate replacement process is illustrated in FIGS. 8A, 8B, and 8C, which illustrate the device 100 along the B-B line of FIGS. 2A and 2B. In an embodiment, the operation 24 performs a CMP process to the device 100 to expose a top surface of the hard mask layer 126, such as shown in FIG. 8A. Then, the operation 24 performs one or more etching process to remove the hard mask layer 126, the sacrificial gate electrode layer 122, and the sacrificial gate dielectric layer 120. The etching process may include dry etching, wet etching, reactive ion etching, combinations thereof, or other suitable etching processes. The etching process is tuned selective to the materials of the hard mask layer 126, the sacrificial gate electrode layer 122, and the sacrificial gate dielectric layer 120, with no (or minimal) etching to the ILD layer 118, the CESL 116, and the fins 103. As depicted in FIG. 8B, the etching process results in gate trenches 125 between two opposing gate spacers 124. The gate trenches 125 expose channel regions of the fins 103. In embodiments where the device 100 includes gate-all-around devices such as nanosheet devices or nanowire devices, the operation 24 may further perform a channel release process within the gate trenches 125 where some layers of the fins 103 are removed, leaving semiconductor channel layers suspended between and connecting to the S/D features 108. After the gate trenches 125 are formed (and optionally, semiconductor channel layers are released), the operation 24 deposits a functional gate stack 130 within each gate trench 125, such as depicted in FIG. 8C. In an embodiment, the functional gate stack 130 includes a gate dielectric layer 131 and a gate electrode layer 132 over the gate dielectric layer 131. The gate dielectric layer 131 may include a high-k dielectric material such as hafnium oxide, zirconium oxide, lanthanum oxide, titanium oxide, yttrium oxide, and strontium titanate. The gate dielectric layer 131 may be formed by chemical oxidation, thermal oxidation, atomic layer deposition (ALD), chemical vapor deposition (CVD), and/or other suitable methods. In some embodiments, the functional gate stack 130 further includes an interfacial layer between the gate dielectric layer 131 and the fin 103. The interfacial layer may include silicon dioxide, silicon oxynitride, or other suitable materials. In some embodiments, the gate electrode layer 132 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 132 may be formed by CVD, PVD, plating, and/or other suitable processes. Since the functional gate stack 130 includes a high-k dielectric layer and metal layer(s), it is also referred to as a high-k metal gate.

Figure 9:
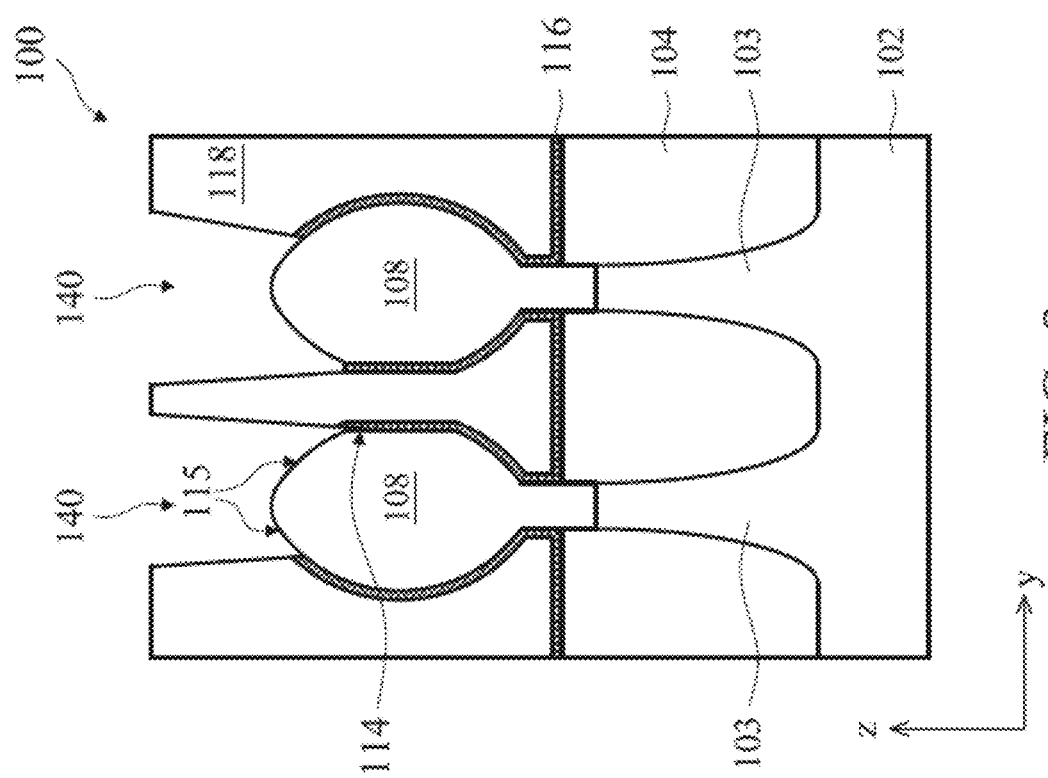

At operation 26, the method 10 (FIG. 1B) etches the ILD layer 118 and the CESL 116 to form S/D contact holes 140, such as shown in FIG. 9. Referring to FIG. 9, the contact holes 140 expose portions of the S/D features 108. The operation 26 may include a variety of processes such as photolithography processes and etching processes. For example, the operation 26 may form a patterned mask over the device 100 using a photolithography process. The patterned mask provides openings that correspond to areas of the device 100 to be etched. Then, the operation 26 performs one or more etching processes through the openings of the patterned mask to form the contact holes 140. The one or more etching processes are tuned selective to the materials of the ILD layer 118 and the CESL 116 and has no (or little) etching to the S/D features 108. As a result of the operation 26, portions of the S/D features 108 are exposed in the contact holes 140. Particularly, at least some of the contact holes 140 expose the vertical or near-vertical surfaces 114 as well as some of the sloped surfaces 115 of the S/D features 108. In the embodiment shown in FIG. 9, the contact hole 140 on the left exposes a portion of the surface 114 and some portions of the surfaces 115, and the CESL 116 is disposed on a lower portion of the surface 114 and remaining portions of the surfaces 115. Further, due to the asymmetric shape of the S/D feature 108, the contact hole 140 is etched deeper along the surface 114 than on the opposing side that lands on the sloped surface 115. The deeper contact hole exposes more surfaces of the S/D feature 108 for making S/D contacts, thereby reducing S/D contact resistance. The contact hole 140 on the right does not expose the surface 114 which is still fully covered by the CESL 116. The present disclosure contemplates that the contact hole 140 may or may not expose the surface 114 or may expose a part of or the whole of the surface 114 in various embodiments.

Figure 10:
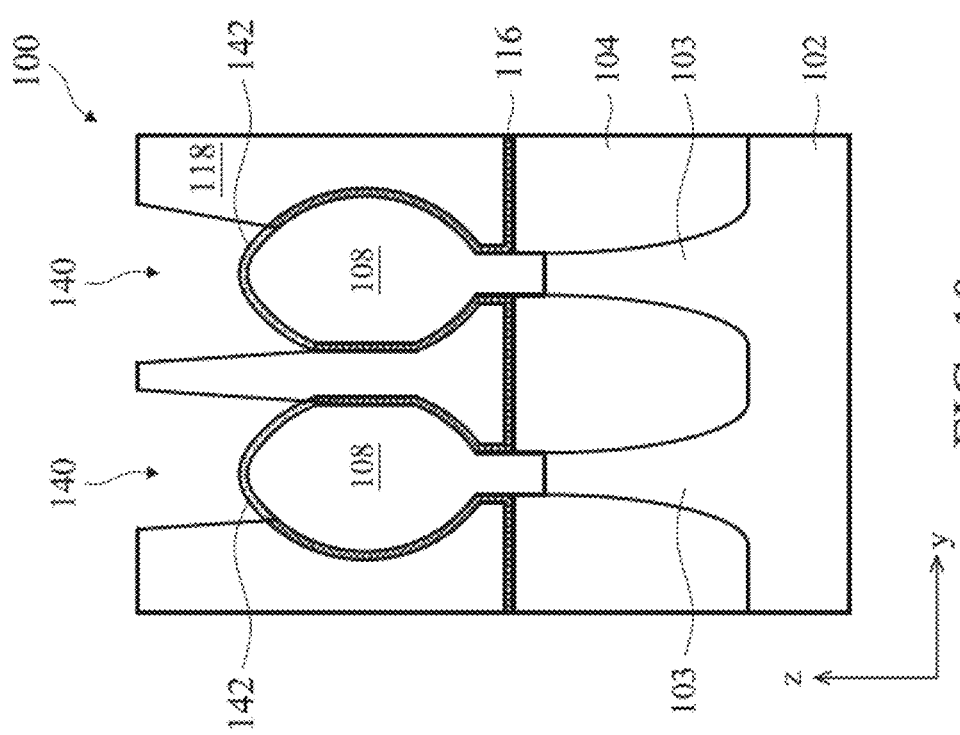

At operation 28, the method 10 (FIG. 1B) forms silicide features 142 over the exposed surfaces of the S/D features 108, such as illustrated in FIG. 10. Referring to FIG. 10, the silicide features 142 are formed on surfaces of the S/D features 108 that are exposed in the contact holes 140. Particularly, some of the silicide features 142 are formed on the vertical or near-vertical surfaces 114, such as on the top portion of the surface 114. In an embodiment, the operation 28 includes depositing one or more metals into the contact holes 140, performing an annealing process to the device 100 to cause reaction between the one or more metals and the S/D features 108 to produce the silicide features 142, and removing un-reacted portions of the one or more metals, leaving the silicide features 142 exposed in the contact holes 140. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 142 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Figure 11:
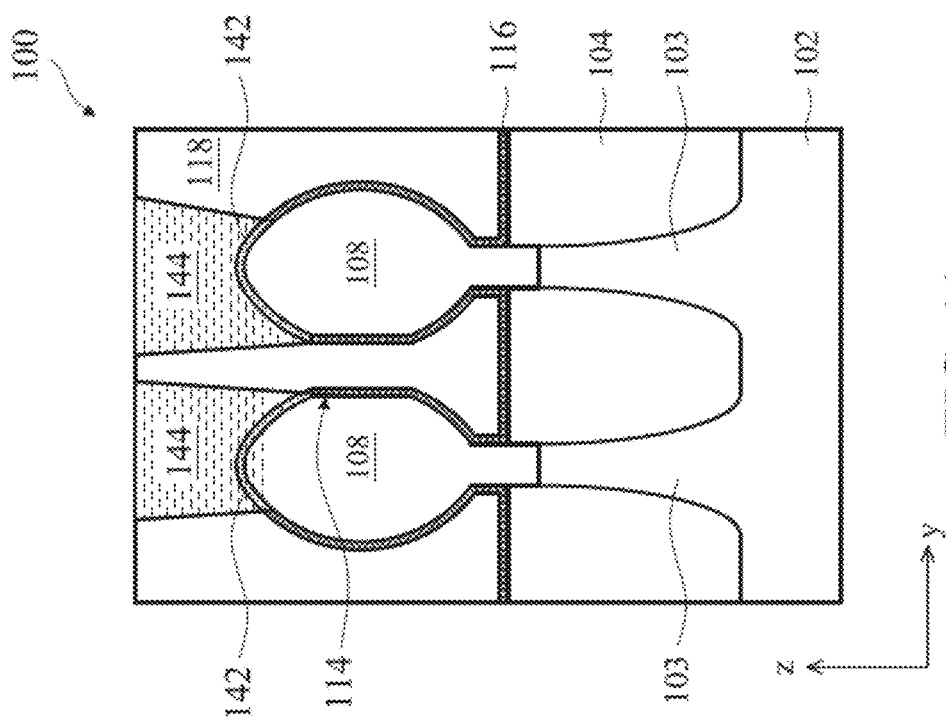

At operation 30, the method 10 (FIG. 1B) forms S/D contacts 144 over the silicide features 142, such as shown in FIG. 11. In an embodiment, the S/D contacts 144 may include a conductive barrier layer on bottom and sidewalls of the contact holes 140 and a metal fill layer over the conductive barrier layer. The conductive barrier layer functions to prevent metal materials of the metal fill layer from diffusing into the ILD layer 118. The conductive barrier layer may include a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), copper (Cu), or other metals, and may be formed by CVD, PVD, ALD, plating, or other suitable processes. As illustrated in FIG. 11, some portion of the contact 144 may be disposed laterally (along the "y" direction) between the vertical or near-vertical surface 114 and a sidewall of the ILD layer 118.

Figure 12:
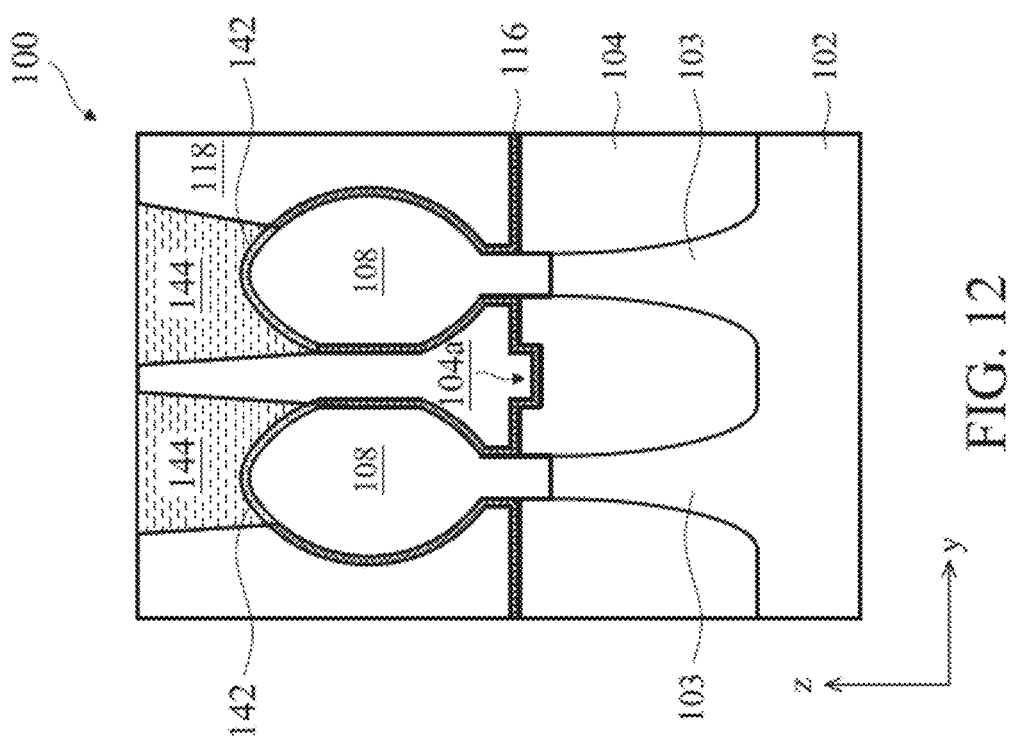
Figure 13:
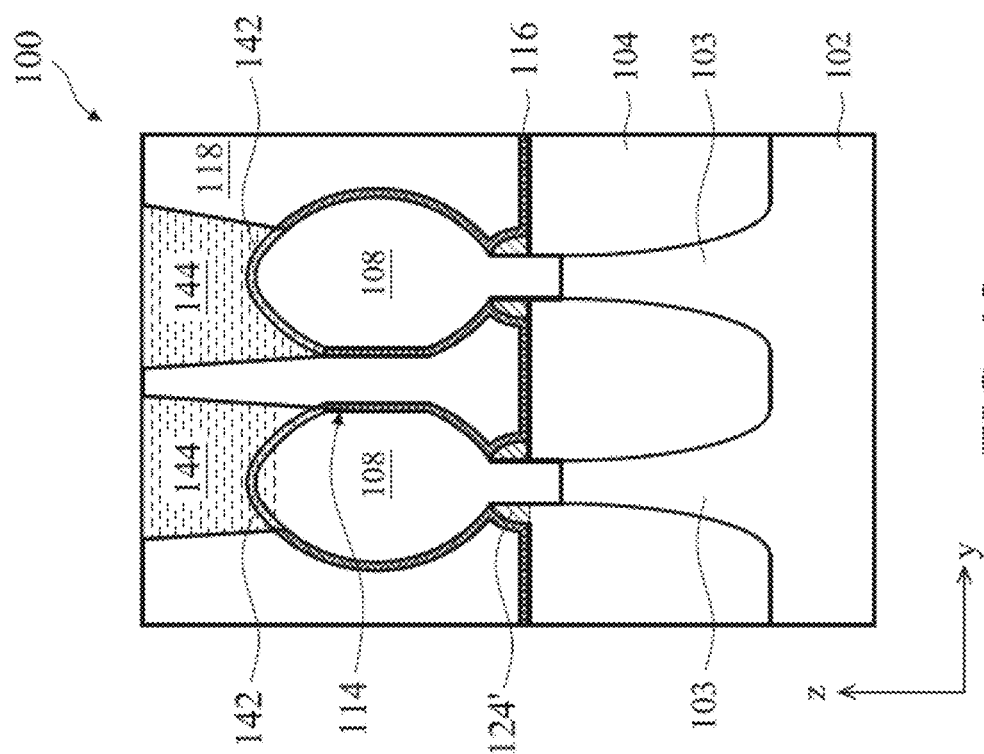

FIG. 12 illustrates another embodiment of the device 100 post the operation 30 where the isolation structure 104 includes the dip 104a (see FIGS. 5C-1 and 6-1). The CESL 116 is formed over the surface of the dip 104a and the ILD layer 118 fills the remaining space of the dip 104a. FIG. 13 illustrates yet another embodiment of the device 100 post the operation 30 where the device 100 includes the fin sidewall spacers 124' (see FIG. 2C-1). The S/D features 108 extend from the fins 103 and through a space between two opposing fin sidewall spacers 124'. The CESL 116 is disposed over various surfaces of the fin sidewall spacers 124'.

At operation 32, the method 10 (FIG. 1B) performs further steps to complete the fabrication of the device 100. For example, it may perform various processes to form gate contacts electrically coupled to the gate stacks 130 and form metal interconnects connecting the S/D contacts 144 to other portions of the device 100 to form a complete IC. Further, although the embodiments shown in FIGS. 2A-13 include fins 103 (therefore applicable to FinFETs), the present disclosure is not so limited, and the disclosed techniques can be applied to planar transistors or other types of multi-gate transistors for improving S/D EPI processes.

Although not intended to be limiting, embodiments of the present disclosure provide one or more of the following advantages. First, the design window for fin definition is relaxed, i.e., the fins can be designed closer without concerns of EPI merging defects. This enables further scaling down. Second, EPI merging defects are eliminated, thereby improving manufacture yield. Third, the S/D EPIs have asymmetric profile with one side being formed near-vertical. This side can be exposed deeper than other sides having gentler slopes during contact etching. This generally enlarges the source/drain contact area and reduces source/drain contact resistance.

In one example aspect, the present disclosure is directed to a method that includes etching two source/drain regions over a substrate to form two source/drain trenches; epitaxially growing two source/drain features in the two source/drain trenches respectively; performing a cut process to the two source/drain features; and after the cut process, depositing a contact etch stop layer (CESL) over the two source/drain features.

In some embodiments, the method further includes depositing an inter-level dielectric (ILD) layer over the CESL;

etching contact holes through the ILD layer and the CESL to expose the source/drain features; and forming contacts in the contact holes. In a further embodiment, after the depositing of the ILD layer and before the etching of the contact holes, the method further includes replacing a sacrificial gate with a high-k metal gate adjacent to at least one of the source/drain features.

In an embodiment of the method, the two source/drain trenches are formed atop two semiconductor fins respectively. In another embodiment of the method, the two source/drain features merge before the cut process is performed and are separated by the cut process. In an embodiment of the method, performing the cut process includes applying an anisotropic etching that is selective to a material of the two source/drain features.

In some embodiments of the method where the two source/drain features are formed atop two fins that are generally parallel with each from a top view, performing the cut process includes forming a patterned mask having an opening that is between the two fins and is generally parallel with the two fins from the top view.

In some embodiments of the method, the cut process also etches an isolation structure over the substrate, resulting in a dip in the isolation structure and between the two source/drain features. In a further embodiment, the CESL is deposited on a surface of the dip.

In another example aspect, the present disclosure is directed to a method that includes providing a structure having a substrate, an isolation structure over the substrate, two fins extending from the substrate and above the isolation structure, and sacrificial gates over the isolation structure and engaging the fins. The method further includes etching the two fins in source/drain regions to form two source/drain trenches side by side; epitaxially growing two source/drain features in the two source/drain trenches; performing a cut process to the two source/drain features; after the cut process, depositing a contact etch stop layer (CESL) over the two source/drain features; depositing an inter-level dielectric (ILD) layer over the CESL; and replacing the sacrificial gates with high-k metal gates.

In an embodiment, after the replacing of the sacrificial gates, the method further includes etching contact holes that penetrate the ILD layer and the CESL and expose the two source/drain features and forming contacts in the contact holes. In a further embodiment, before the forming of the contacts, the method further includes forming silicide features over the two source/drain features exposed in the contact holes.

In an embodiment, the performing of the cut process includes forming an anti-reflective coating (ARC) layer over the structure; forming a photoresist layer over the ARC layer; patterning the photoresist layer to form an opening that is between the two fins and generally parallel with the two fins from a top view; and etching the two source/drain features through the opening.

In an embodiment, the performing of the cut process includes applying an anisotropic etching process to the two source/drain features. In an embodiment, the performing of the cut process separates the two source/drain features that merge during the epitaxially growing.

In yet another example aspect, the present disclosure is directed to a device that includes a substrate; an isolation structure over the substrate; two fins extending from the substrate and above the isolation structure; two source/drain features over the two fins respectively and being side by side along a first direction generally perpendicular to a lengthwise direction of the two fins from a top view, each of the two source/drain features having a near-vertical side, the two near-vertical sides facing each other along the first direction; a contact etch stop layer (CESL) disposed on at least a lower portion of the near-vertical side of each of the two source/drain features; and contact features disposed over the two source/drain features and over the CESL.

In some embodiments of the device, the isolation structure includes a dip between the two source/drain features and the CESL is also disposed on a surface of the dip. In some embodiments of the device, each of the two source/drain features further includes sloped sides, wherein the sloped sides and the near-vertical side are on opposing sides of the fin where the respective source/drain feature is grown. In some embodiments of the device, the CESL is also disposed on the sloped sides of the two source/drain features.

In an embodiment, the device further includes silicide features disposed on at least an upper portion of the near-vertical side of each of the two source/drain features, wherein the contact features are disposed on the silicide features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
an isolation structure over the substrate;
two fins extending from the substrate and above the isolation structure;
two source/drain structures over the two fins respectively and being side by side along a first direction generally perpendicular to a lengthwise direction of the two fins from a top view, each of the two source/drain structures having a near-vertical side, the two near-vertical sides facing each other along the first direction;
a contact etch stop layer (CESL) disposed on at least a lower portion of the near-vertical side of each of the two source/drain structures; and
two contacts disposed over the two source/drain structures, respectively, and over the CESL,
wherein the isolation structure includes a dip between the two source/drain structures and the CESL is also disposed on a surface of the dip.

2. The device of claim 1, wherein each of the two source/drain structures further includes a sloped side, wherein the sloped side and the near-vertical side of each of the two source/drain structures are on opposing sides of the fin where the respective source/drain structure is grown.

3. The device of claim 2, wherein the CESL is also disposed on the sloped sides of the two source/drain structures.

4. The device of claim 2, wherein each of the contacts extends lower on the near-vertical side than on the sloped side of the respective source/drain structure.

5. The device of claim 1, further comprising:
silicide layers disposed on at least an upper portion of the near-vertical side of each of the two source/drain structures, wherein the contacts are disposed on the silicide layers.

6. The device of claim 1, further comprising fin sidewall spacers, wherein each of the two source/drain structures extend through a space between two opposing fin sidewall spacers.

7. The device of claim 6, wherein the CESL is also disposed on sidewalls of the fin sidewall spacers.

8. The device of claim 2, wherein the sloped side of each of the two source/drain structures has a continuous curved profile.

9. A device, comprising:
a substrate;
an isolation structure over the substrate;
two fins extending from the substrate and surrounded by the isolation structure;
two source/drain structures over the two fins respectively, each of the two source/drain structures having a bottom portion and a top portion;
a contact etch stop layer (CESL) disposed on each of the two source/drain structures; and
two contacts directly over and electrically connected to the two source/drain structures, respectively,
wherein the bottom portion of each of the source/drain structures extends below a top surface of the isolation structure,
wherein the top portion of each of the source/drain structures has a sloped surface and a near-vertical surface on two sides of the respective fin, and the near-vertical surfaces of the two source/drain structures face each other.

10. The device of claim 9, further comprising:
a silicide layer between each of the source/drain structures and the respective contact.

11. The device of claim 9, wherein the top portion of each of the source/drain structures has a shape that is asymmetric with respect to a plane going through a centerline of the respective fin.

12. The device of claim 9, wherein in a cross-sectional view cut perpendicular to a lengthwise direction of the fins, each of the contacts extends from a first point on the respective near-vertical surface to a second point on the respective sloped surface, wherein the first point is lower than the second point.

13. The device of claim 9, further comprising an inter-level dielectric layer over the CESL and between the near-vertical surfaces of the two source/drain structures.

14. The device of claim 9, wherein the isolation structure includes a dip between the two source/drain structures and the CESL is also disposed on a surface of the dip.

15. The device of claim 9, wherein each of the two source/drain structures has an outer layer over an inner layer, and the inner layer includes a higher dopant concentration than the outer layer.

16. The device of claim 15, wherein a distance between a centerline of one of the two fins to the outer layer of the one of the two fins is greater than half of a fin pitch between the two fins.

17. A device, comprising:
a substrate;
first and second fins protruding out of the substrate, each of the first and the second fins extending lengthwise along a first direction and spaced apart from each other along a second direction perpendicular to the first direction;
an isolation structure over the substrate and disposed between the first fin and the second fin;
first and second source/drain structures over the first and the second fins respectively, each of the first and the second source/drain structures having a sloped surface and a near-vertical surface, thereby presenting a shape that is asymmetric with respect to a plane going through a centerline of the respective fin;
a contact etch stop layer (CESL) disposed directly on a first portion of each of the first and the second source/drain structures;
silicide layers disposed directly on a second portion of each of the first and the second source/drain structures;
contacts directly over and contacting the silicide layers; and
an inter-level dielectric layer over and in direct contact with the CESL and between the near-vertical surfaces of the two source/drain structures, and the inter-level dielectric layer directly interfaces the contacts,
wherein the near-vertical surfaces of the two source/drain structures face each other.

18. The device of claim 17, wherein the CESL is also disposed directly on the isolation structure.

19. The device of claim 17, wherein along the second direction, a spacing between the near-vertical surface of the first fin to a centerline of the first fin is smaller than a spacing between the sloped surface of the first fin to the centerline of the first fin.

20. The device of claim 19, wherein along the second direction, a spacing between the near-vertical surface of the second fin to a centerline of the second fin is smaller than a spacing between the sloped surface of the second fin to the centerline of the second fin.

* * * * *